United States Patent
Wengreen

(10) Patent No.: US 9,339,112 B2
(45) Date of Patent: *May 17, 2016

(54) MOUNTING SYSTEMS FOR ELECTRONIC DEVICES

(71) Applicant: Innovelis, Inc., Sammamish, WA (US)

(72) Inventor: Eric John Wengreen, Sammamish, WA (US)

(73) Assignee: Innovelis, Inc., Sammamish, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/572,293

(22) Filed: Dec. 16, 2014

(65) Prior Publication Data

US 2015/0305502 A1 Oct. 29, 2015

Related U.S. Application Data

(63) Continuation-in-part of application No. 14/260,577, filed on Apr. 24, 2014, now Pat. No. 8,939,417, and a continuation-in-part of application No. 14/527,687, filed on Oct. 29, 2014, now Pat. No. 8,988,616, which is a continuation of application No. 14/478,655, filed on Sep. 5, 2014, now Pat. No. 8,896,768, application No. 14/572,293, which is a continuation-in-part of application No. 14/482,070, filed on Sep. 10, 2014, now Pat. No. 8,934,061, which is a continuation of application No. 14/480,830, filed on Sep. 9, 2014, now Pat. No. 8,934,060.

(51) Int. Cl.
| | |
|---|---|
| *F16M 13/02* | (2006.01) |
| *A47B 97/00* | (2006.01) |
| *H05K 5/02* | (2006.01) |
| *F16M 11/04* | (2006.01) |
| *A47F 5/00* | (2006.01) |

(52) U.S. Cl.
CPC .............. *A47B 97/00* (2013.01); *F16M 11/041* (2013.01); *F16M 13/02* (2013.01); *H05K 5/0204* (2013.01); *A47B 2097/005* (2013.01); *A47F 5/0025* (2013.01)

(58) Field of Classification Search
USPC ................ 248/205.4, 205.3, 690, 309.1, 310, 248/311.2, 316.7, 339; 348/825, 844, 348/836–843; 312/7.2
See application file for complete search history.

(56) References Cited

U.S. PATENT DOCUMENTS

| | | |
|---|---|---|
| 1,618,573 A | 2/1927 | Cole |
| 2,584,646 A | 2/1952 | Wagstaff |

(Continued)

OTHER PUBLICATIONS

Out of Sight Bracket—Website Part 1 (downloaded on Nov. 13, 2013 from http://www.outofsightbracket.com/OutOfSightBracket/Out_of_Sight_Bracket_for_Apple_TV.html). The website says the Out of Sight Bracket is "Patent Pending." The Out of Sight Bracket might have been made by Gordon H. Beckhart.

(Continued)

*Primary Examiner* — Alfred J Wujciak

(57) ABSTRACT

Mounts can hold electronic devices. Some mounts can attach digital media players to a wall, such as a wall of a home or a backside of a television. In some embodiments, mounts include a tray with side walls that hold electronic devices at least partially inside the mounts. In several embodiments, mounts include flexible necks connected to adhesive surfaces. The flexible necks can flex independently of each other to enable a mount to attach electronic devices to a wall that is not flat.

19 Claims, 17 Drawing Sheets

(56) References Cited

U.S. PATENT DOCUMENTS

| | | | |
|---|---|---|---|
| 3,091,378 A | 5/1963 | O'Dwyer | |
| 3,176,950 A | 4/1965 | Hittesdorf | |
| 3,279,009 A | 10/1966 | Teasdale | |
| 3,294,298 A | 12/1966 | Danielson | |
| 3,477,679 A | 11/1969 | Lovitz | |
| 3,990,617 A | 11/1976 | Carter | |
| 4,067,532 A | 1/1978 | Viteretto | |
| 4,519,656 A | 5/1985 | Raz | |
| 4,602,761 A | 7/1986 | Carter | |
| 4,697,780 A | 10/1987 | Wenkman | |
| 4,746,042 A | 5/1988 | King | |
| 4,771,927 A | 9/1988 | Ventura | |
| 4,815,683 A | 3/1989 | Ferrante | |
| 4,825,590 A | 5/1989 | Cullinane | |
| 4,826,115 A | 5/1989 | Novitski | |
| 4,840,773 A | 6/1989 | Wade | |
| 4,852,843 A | 8/1989 | Chandler | |
| 4,974,764 A | 12/1990 | Cantwell | |
| 5,038,985 A | 8/1991 | Chapin | |
| 5,092,395 A | 3/1992 | Amidzich | |
| 5,273,690 A | 12/1993 | McDowell | |
| 5,297,318 A | 3/1994 | Adolphson | |
| D351,341 S | 10/1994 | Hung | |
| 5,400,990 A | 3/1995 | Frankel | |
| 5,535,093 A | 7/1996 | Noguchii | |
| 5,593,124 A | 1/1997 | Wang | |
| 5,619,395 A | 4/1997 | McBride | |
| 5,619,774 A | 4/1997 | Perry | |
| D388,107 S | 12/1997 | Huckins | |
| 5,850,998 A | 12/1998 | Parsey | |
| 5,899,371 A | 5/1999 | Weliver | |
| 5,914,707 A | 6/1999 | Kono | |
| 5,961,083 A | 10/1999 | Hartmann | |
| 5,979,724 A | 11/1999 | Loewenthal | |
| 6,039,173 A | 3/2000 | Crow | |
| 6,102,660 A | 8/2000 | Lee | |
| 6,105,923 A | 8/2000 | Robertson | |
| 6,163,997 A | 12/2000 | Deralas | |
| D443,493 S | 6/2001 | Skeem | |
| 6,275,885 B1 | 8/2001 | Chin | |
| 6,336,615 B1 | 1/2002 | Jeon | |
| D456,413 S | 4/2002 | Malson | |
| 6,485,144 B1 | 11/2002 | Liao | |
| 6,560,983 B1 | 5/2003 | Schimmeyer | |
| 6,691,374 B2 | 2/2004 | Coyne | |
| 6,888,940 B1 | 5/2005 | Deppen | |
| 6,939,641 B2 | 9/2005 | Kincaid | |
| 7,047,601 B1 | 5/2006 | Vernon-Woods | |
| 7,079,384 B2 | 7/2006 | Wang | |
| 7,080,764 B2 | 7/2006 | McNicholas | |
| 7,113,218 B2 | 9/2006 | Battles | |
| 7,145,603 B2 | 12/2006 | Whitby | |
| D535,826 S | 1/2007 | Toghanian | |
| 7,222,762 B2 | 5/2007 | Rees | |
| D545,343 S | 6/2007 | Braun | |
| D560,411 S | 1/2008 | Chung | |
| D565,399 S | 4/2008 | Grey | |
| 7,367,089 B2 | 5/2008 | Cooke | |
| D570,801 S | 6/2008 | Allen | |
| D598,945 S | 8/2009 | Gillespie | |
| 7,580,255 B2 | 8/2009 | Crooijmans | |
| D624,949 S | 10/2010 | Nakayama | |
| D625,729 S | 10/2010 | McNames | |
| D628,611 S | 12/2010 | Lewis | |
| 7,854,420 B2 * | 12/2010 | Depay et al. | 248/316.7 |
| D633,503 S | 3/2011 | Bo | |
| 7,959,121 B1 | 6/2011 | Barnes | |
| D657,362 S | 4/2012 | Lister | |
| D662,491 S | 6/2012 | Andre | |
| D667,411 S | 9/2012 | Kim | |
| 8,322,584 B2 | 12/2012 | Dethmers | |
| 8,544,805 B2 | 10/2013 | Virgin | |
| 8,848,113 B2 | 9/2014 | Wengreen | |
| 8,896,768 B1 | 11/2014 | Wengreen | |
| 8,934,060 B1 | 1/2015 | Wengreen | |
| 8,934,061 B1 | 1/2015 | Wengreen | |
| 8,939,417 B1 * | 1/2015 | Wengreen | 248/311.2 |
| 8,988,616 B2 | 3/2015 | Wengreen | |
| 9,131,195 B2 | 9/2015 | Wengreen | |
| 2005/0211861 A1 * | 9/2005 | Lee et al. | 248/309.1 |
| 2005/0236541 A1 | 10/2005 | Chang | |
| 2007/0264169 A1 | 11/2007 | Chen | |
| 2008/0078793 A1 | 4/2008 | Brown | |
| 2009/0218454 A1 | 9/2009 | Stanley | |
| 2010/0288895 A1 | 11/2010 | Shamie | |
| 2010/0314277 A1 | 12/2010 | Murray | |
| 2012/0126081 A1 | 5/2012 | Wengreen | |
| 2012/0127379 A1 * | 5/2012 | Wengreen et al. | 348/836 |
| 2014/0061406 A1 | 3/2014 | Chevalier | |

OTHER PUBLICATIONS

Out of Sight Bracket—Website Part 2 (downloaded on Nov. 13, 2013 from http://www.outofsightbracket.com/OutOfSightBracket/How_to_mount_your_Apple_TV_or_AirPort_Express.html). The website says the Out of Sight Bracket is "Patent Pending." The Out of Sight Bracket might have been made by Gordon H. Beckhart.

Out of Sight Bracket—Website Part 3 (downloaded on Nov. 13, 2013 from http://www.soundandvision.com/content/bracket-keeps-apple-airport-express-and-apple-tv-out-sight).

TV Tray—Website (downloaded on Nov. 13, 2013 from http://h-sq.com/products/tvtray/).

TV Tray—Installation Guide (downloaded on Nov. 13, 2013 from http://www.h-sq.com/downloads/tvtx_ug.pdf).

Cosmos Tray—Website (downloaded on Nov. 13, 2013 from http://www.amazon.com/Cosmos-MD199LL-AirPort-Express-Station/dp/B00C2JNGB2/ref=sr_1_4?ie=UTF8&qid=1384406376&sr=8-4&keywords=apple+tv+mount).

CTA Digital—Website (downloaded on Nov. 13, 2013 from http://www.ctadigital.com/downloads/KIN-WMC-final.pdf).

PDP Mounting Clip—Part 1 (downloaded on Nov. 13, 2013 from http://www.amazon.com/Kinect-Sensor-TV-Mounting-Clip-Xbox/dp/B004XV6ST4).

PDP Mounting Clip—Part 2 (downloaded on Nov. 13, 2013 from http://www.microsoftstore.com/store/msusa/en_US/pdp/Kinect-Sensor-TV-Mounting-Clip/productID.253726200).

PDP Mounting Clip—Part 3 (downloaded on Nov. 13, 2013 from http://www.bestbuy.com/site/pdp-sensor-mounting-clip-for-kinect/3521258.p?id=1218408957863&skuld=3521258).

ScreenDeck (downloaded on Nov. 13, 2013 from http://news.cnet.com/8301-17938_105-20071226-1/screendeck-adds-top-shelf-to-your-flat-panel-tv/).

Center Stage Bracket—Part 1 (downloaded on Nov. 13, 2013 from http://www.bestbuy.com/site/center-stage-bracket-satellite-center-channel-speaker-shelf-bracket-black/5857191.p?id=1218697292805&skuld=5857191).

Center Stage Bracket—Part 2 (downloaded on Nov. 13, 2013 from http://www.bestbuy.com/site/center-stage-bracket-satellite-center-channel-speaker-shelf-bracket-black/5857191.p?id=1218697292805&skuld=5857191).

DreamGear TriMount (downloaded on Nov. 14, 2013 from http://www.dreamgear.net/shop-by-platform/universal/trimount.html).

Cisco router wall mounting instructions (downloaded on Jan. 2, 2014 from http://www.cisco.com/en/US/docs/routers/access/1800/1841/hardware/installation/guide/18inst.pdf).

Cisco wall mounting bracket (downloaded on Jan. 2, 2014 from http://www.cisco.com/en/US/docs/routers/access/800/806/hardware/installation/guide/install.pdf).

Netgear ProSafe (downloaded on Jan. 2, 2014 from http://www.storagereview.com/netgear_prosafe_wndap660_dualband_wireless_access_point_review) article includes a date of Dec. 21, 2012.

Wireless router picture (downloaded on Jan. 2, 2014 from http://www.techwarelabs.com/wp-content/gallery/engenius-esr9850-wireless-router/router-bottom.jpg).

Apple TV, downloaded on Feb. 3, 2014 from http://www.apple.com/appletv/what-is/.

Roku media players—Part 1, downloaded on Feb. 3, 2014 from http://www.roku.com/products/roku-2.

(56) References Cited

OTHER PUBLICATIONS

Roku media players—Part 2, downloaded on Feb. 3, 2014 from http://www.roku.com/products/compare.

Innovelis, Inc. Product—TotalMount—Apple TV Mounting Kit, downloaded from Amazon.com on Feb. 3, 2014, first available on Amazon.com on Jun. 22, 2011: http://www.amazon.com/TotalMount-Apple-Universal-Mounting-Kit/dp/B0057CVH6W/ref=sr_1_1?ie=UTF8&qid=1391473446&sr=8-1&keywords=TOTALMOUNT.

Innovelis, Inc. Product—TotalMount—Roku Mounting Kit, downloaded from Amazon.com on Feb. 3, 2014, first available on Amazon.com on Jun. 14, 2012: http://www.amazon.com/TotalMount-ROKU-UNIVERSAL-MOUNTING-Compatible/dp/B008B1125W/ref=sr_1_2?ie=UTF8&qid=1391473922&sr=8-2&keywords=totalmount.

Innovelis, Inc. Product—TotalMount—Remote Holder, downloaded from Amazon.com on Feb. 3, 2014, first available on Amazon.com on Jul. 2, 2013: http://www.amazon.com/Apple-TV-Remote-Holder-TotalMount/dp/B00DR76YJO/ref=sr_1_3?ie=UTF8&qid=1391474218&sr=8-3&keywords=totalmount.

Innovelis, Inc. Product—TotalMount—AirPort Express Mounting Kit, downloaded from Amazon.com on Feb. 3, 2014, first available on Amazon.com in approximately Sep. 2012: http://www.amazon.com/TotalMount-AirPort-Express-Mounting-Kit/dp/B009HC7BL8/ref=sr_1_4?ie=UTF8&qid=1391474218&sr=8-4&keywords=totalmount.

Innovelis, Inc. Product—TotalMount—Roku Mounting Kit (Version 1), downloaded from Amazon.com on Feb. 3, 2014, first available on Amazon.com on Jan. 19, 2012: http://www.amazon.com/TotalMount-ROKU-MOUNTING-Compatible-Roku/dp/B006ZS4R46/ref=sr_1_5?ie=UTF8&qid=1391474218&sr=8-5&keywords=totalmount.

Innovelis, Inc. Product—TotalMount—AirPort Extreme Mounting Kit, downloaded from Amazon.com on Feb. 3, 2014, first available on Amazon.com in approximately Apr. 2013: http://www.amazon.com/TotalMount-Compatible-generations-compatible-generation/dp/B00CK2CDLK/ref=sr_1_7ie=UTF8&qid=1391474218&sr=8-7&keywords=totalmount.

Innovelis, Inc. Product—TotalMount—Vizio Mounting Kit, downloaded from Amazon.com on Feb. 3, 2014, first available on Amazon.com in approximately May 2013: http://www.amazon.com/TotalMount-VIZIO-Co-Star-Mounting-Kit/dp/B00GDMXSZ8/ref=sr_1_10?ie=UTF8&qid=1391474218&sr=8-10&keywords=totalmount.

Amazon Fire TV, downloaded on Jun. 2, 2014 from http://www.amazon.com/Fire-TV-streaming-media-player/dp/B00CX5P8FC.

Logitech HD Pro Webcam C910, downloaded on Oct. 9, 2014 from http://www.amazon.com/Logitech-Webcam-C910-1080p-Video/dp/B003M2YT96/ref=sr_1_6?ie=UTF8&qid=1287528024&sr=8-6.

HP KQ246AA 8.0 MP Deluxe Webcam, downloaded on Oct. 9, 2014 from http://www.amazon.com/HP-KQ246AA-8-0-Deluxe-Webcam/dp/B001D8AGA2/ref=sr_1_4?ie=UTF8&qid=1410543707&sr=8-4&keywords=hp+webcam.

Logitech Webcam C200, downloaded on Oct. 9, 2014 from http://www.amazon.com/Logitech-960-000415-Webcam-C200/dp/B002GP7ZTQ/ref=pd_cp_pc_0.

USB 6 LED PC Webcam, downloaded on Oct. 9, 2014 from http://www.amazon.com/Webcam-Camera-Night-Vision-Meeting/dp/B00MTGV4F8/ref=sr_1_88?s=electronics&ie=UTF8&qid=1410543946&sr=1-88&keywords=webcann+clamp.

\* cited by examiner

MOUNTING SYSTEMS FOR ELECTRONIC DEVICES

CROSS-REFERENCE TO RELATED APPLICATIONS

This application claims the benefit as a continuation-in-part of U.S. Nonprovisional application Ser. No. 14/527,687, filed on Oct. 29, 2014 and titled Mounting Systems for Digital Media Players, which claims the benefit as a continuation of U.S. Nonprovisional application Ser. No. 14/478,665, filed on Sep. 5, 2014 and titled Mounting Systems for Digital Media Players. The entire contents of the following applications are incorporated by reference herein: U.S. Nonprovisional application Ser. No. 14/527,687, filed on Oct. 29, 2014 and titled Mounting Systems for Digital Media Players; and U.S. Nonprovisional application Ser. No. 14/478,665, filed on Sep. 5, 2014 and titled Mounting Systems for Digital Media Players.

This application claims the benefit as a continuation-in-part of U.S. Nonprovisional application Ser. No. 14/482,070, filed on Sep. 10, 2014 and titled Mounting Systems for Digital Media Players, which claims the benefit as a continuation of U.S. Nonprovisional application Ser. No. 14/480,830, filed on Sep. 9, 2014 and titled Mounting Systems for Digital Media Players. The entire contents of the following applications are incorporated by reference herein: U.S. Nonprovisional application Ser. No. 14/482,070, filed on Sep. 10, 2014 and titled Mounting Systems for Digital Media Players; and U.S. Nonprovisional application Ser. No. 14/480,830, filed on Sep. 9, 2014 and titled Mounting Systems for Digital Media Players.

This application claims the benefit as a continuation-in-part of U.S. Nonprovisional application Ser. No. 14/260,577, filed on Apr. 24, 2014 and titled Mounting Systems for Electronic Devices, which is incorporated by reference herein.

BACKGROUND

1. Field

Various embodiments disclosed herein relate to mounting systems and mounting methods. Certain embodiments relate to mounting systems for electronic devices such as digital media players.

2. Description of Related Art

Electronic devices can be electronically and even physically coupled to other electronic devices. For example, a digital media player can be coupled to a television by a High-Definition Multimedia Interface (HDMI) cable to enable the television to display media, such as movies, from the digital media player. The digital media player can receive media from the Internet through many different content providers such as Netflix Inc.

Mounting systems can be used to couple electronic devices to a wall. Mounting systems can hold electronic devices while the electronic devices provide media from the Internet to televisions. There is a need for systems and methods to reliably mount electronic devices to diverse types of walls and surfaces.

SUMMARY

In some embodiments, a mount is configured to hold an electronic device. A mount can comprise a base (or tray) having an outward side and an inward side, a first side wall that protrudes outward from the outward side of the base, and a second side wall that protrudes outward from the outward side of the base. The base can be flat, such that portions of the mount are flat while other portions of the mount are not flat. The first side wall and the second side wall can be configured to couple the electronic device to the flat base.

Some mount embodiments include a first flexible neck that protrudes inward from the inward side of the flat base (or tray). The first flexible neck can couple the flat base to a first flat adhesive surface. The first flexible neck can have a first distal end and a first proximal end. The first proximal end of the first flexible neck can be coupled to the inward side of the flat base. The first distal end of the first flexible neck can be coupled to the first flat adhesive surface.

Some mount embodiments include a second flexible neck that protrudes inward from the inward side of the flat base (or tray). The second flexible neck can couple the flat base to a second flat adhesive surface. The second flexible neck can have a second distal end and a second proximal end. The second proximal end of the second flexible neck can be coupled to the inward side of the flat base. The second distal end of the second flexible neck can be coupled to the second flat adhesive surface.

In several embodiments, the first distal end of the first flexible neck and the second distal end of the second flexible neck are movably coupled to each other (e.g., such that the first flexible neck and the second flexible neck are configured to flex independently of each other to change a first orientation of the first flat adhesive surface relative to the second flat adhesive surface and/or to change a second orientation of the first flat adhesive surface relative to the flat base or tray).

In several embodiments, a mount comprises a platform that protrudes inward from the inward side of the flat base (or tray). The platform can comprise an inwardly facing surface, wherein the inwardly facing surface can comprise a surface area that is greater than a combined surface area of all adhesive surfaces of the mount. The platform can couple at least one flexible neck to the flat base. In some embodiments, the platform couples one, two, three, four, five, or six necks to a base of the mount. The platform can protrude at least 0.2 millimeters, less than 3 millimeters, and/or less than 10 millimeters.

Several embodiments include a third flexible neck and a fourth flexible neck. Each neck can include a distal end and a proximal end. In some embodiments, the necks, a portion of the necks, and/or the proximal ends of the necks are located in a rectangular configuration relative to each other. For example, the necks can be located at corners of an imaginary rectangle.

The mount can include quadrants with a flexible neck attached to each quadrant of the mount. In some embodiments, a base (or tray) comprises a first quadrant, a second quadrant, a third quadrant, and a fourth quadrant. A first flexible neck can be coupled to the first quadrant, a second flexible neck can be coupled to the second quadrant, a third flexible neck can be coupled to the third quadrant, and/or a fourth flexible neck can be coupled to the fourth quadrant.

Some embodiments include two flexible necks coupled to the base (or tray) along a center line of the base. The center line can be located half way between a first side wall and a second side wall. In some embodiments, a first flexible neck is located a first normal distance from the first side wall and a second normal distance from the second side wall. The second flexible neck can be located the first normal distance from the first side wall and the second normal distance from the second side wall. Normal distance can be measured in a direction normal to the sidewall (directly towards a neck).

In several embodiments, the first flat adhesive surface comprises a first center and the second flat adhesive surface comprises a second center. The first distal end of the first flexible neck can be coupled to the first center and the second distal end of the second flexible neck can be coupled to the second center. The adhesive surface can extend radially outward from a distal end of the neck (e.g., relative to a distal end of the neck). In some embodiments, the adhesive surface extends radially outward in all directions that are perpendicular to the distal end of the neck to form a flat adhesion area wherein the distal end of the neck is coupled within the outer perimeter of the adhesion area.

In some embodiments, the neck comprises a bendable beam, which can have a rectangular or circular cross section. The bendable beam can enable the neck to be flexible.

In several embodiments, a first flexible neck comprises a first movable joint located between a first distal end and a first proximal end of the first flexible neck. A second flexible neck can comprise a second movable joint located between a second distal end and a second proximal end of the second flexible neck. Each movable joint can comprise a ball joint having a spherical portion movably coupled to a socket portion. The socket portion can be coupled to the flat base (or tray) and the spherical portion can be coupled to the first flat adhesive surface such that the spherical portion can move relative to the flat base but the spherical portion is rigidly coupled to the first flat adhesive. For example, in some embodiments, the spherical portion can rotate relative to the base (or tray) but cannot rotate relative to the adhesive. The socket portion can comprise at least one slot configured to allow the socket portion to expand to receive the spherical portion (e.g., to push the spherical portion into the socket portion). The outward side of the flat base can comprise an entrance hole to an internal cavity of the socket portion. The spherical portion can be located inside of the internal cavity.

In some embodiments, the first flexible neck is a first rectangular beam that comprises a first length, a first thickness, and a first width. The first length can be at least 2 millimeters and less than 13 millimeters. The first width can be at least twice as large as the first thickness. The second flexible neck can be a second rectangular beam that comprises a second length, a second thickness, and a second width. The second length can be at least 2 millimeters and less than 13 millimeters. The second width can be at least twice as large as the second thickness. In some embodiments, rectangular beams have rounded edges (e.g., fillets, chamfers).

In several embodiments, the first flexible neck protrudes perpendicularly relative to the flat base and/or the first flat adhesive surface is oriented parallel to the flat base (or tray). The second flexible neck can protrude perpendicularly relative to the flat base. The second flat adhesive surface can be oriented parallel to the flat base. The first flat adhesive surface and the second flat adhesive surface can be oriented such that they are coplanar. The first flat adhesive surface can be otherwise unattached to the flat base. For example, severing the neck can cause the first flat adhesive surface to become detached from the flat base (or tray). The second flat adhesive surface can be coupled to the flat base via the second flexible neck, but the second flat adhesive surface can be otherwise unattached to the flat base.

Some embodiments include at least two ribs that protrude outward from the flat base to form a ventilation channel between the ribs. The ventilation channel can be capable of enabling air to flow between the electronic device and the flat base. Several embodiments include many ribs and multiple ventilation channels. Ribs can be oriented perpendicular relative to the flat base. Ribs can be oriented parallel to the first side wall and/or the second side wall.

In some embodiments, a mount can be configured to hold an electronic device on a wall, such as the wall of a building, a surface of a television, or a wall near a television. A mount can include a tray having an outward side and an inward side. A mount can include a first side wall that protrudes outward from the outward side of the tray and a second side wall that protrudes outward from the outward side of the tray. The first side wall and the second side wall can be configured to couple the electronic device to the tray. The electronic device can be a digital media player that can be coupled to a television to provide content (e.g., movies and/or TV shows) to the television.

In some embodiments, a mount includes a first flexible neck that protrudes inward from the inward side of the tray and couples the tray to a first foot. The first flexible neck can have a first distal end and a first proximal end. The first proximal end of the first flexible neck can be coupled to the inward side of the tray. The first distal end of the first flexible neck can be coupled to the first foot. The first foot can comprise a first adhesive surface configured to be coupled to a wall (e.g., of a building or another object).

In several embodiments, a mount comprises a second flexible neck that protrudes inward from the inward side of the tray and couples the tray to a second foot. The second flexible neck can have a second distal end and a second proximal end. The second proximal end of the second flexible neck can be coupled to the inward side of the tray. The second distal end of the second flexible neck can be coupled to the second foot. The second foot can comprise a second adhesive surface configured to be coupled to the wall.

In some embodiments, the first foot and the second foot are configured to flex independently of each other (e.g., to change a first orientation of the first adhesive surface relative to the second adhesive surface and/or to change a second orientation of the first adhesive surface relative to the tray).

In several embodiments, the first foot comprises a first hole, which can be oriented outward towards the tray. A first hook can coupled to the first hole. The second foot can comprise a second hole oriented outward towards the tray. A second hook can be coupled to the second hole. The second adhesive surface can face an inward direction and the second hole can also face the inward direction.

In some embodiments, the first hole is a first slot and the second hole is a second slot. The mount can comprise a left half that comprises the first side wall and the mount can comprise a right half that comprises the second side wall. The first slot can be located on the left half and the second slot can be located on the right half of the mount. Each slot can be at least three times as long as it is wide (where length is defined as the longest side of the slot and width is defined as perpendicular to the length).

Some embodiments include a wire wrapped around the first flexible neck and the second flexible neck, wherein at least a portion of the wire is located inward relative to the tray. As used herein, "wire" is used in a broad sense and includes cords and cables that conduct electricity (e.g., power cords and HDMI cables).

In several embodiments, the first foot comprises a flat, inwardly facing surface. The first hole and the first adhesive surface can be located on the flat, inwardly facing surface of the first foot.

In some embodiments, the first foot comprises a flexible portion that can be oriented perpendicularly relative to the first distal end of the first flexible neck. The flexible portion can protrude perpendicularly 360 degrees around the first distal end. The flexible portion can be configured to bend to enable the first adhesive surface to conform to curved shapes (e.g., a curved wall of a building or object such as a television).

In several embodiments, the first distal end of the first flexible neck protrudes perpendicularly from the first foot. The first foot can comprise a perimeter. In some embodiments, the first foot can be coupled to the tray via the first flexible neck, but the first foot is otherwise unattached to the tray (e.g., such that the perimeter of the first foot protrudes radially away from the first distal end of the first flexible neck).

BRIEF DESCRIPTION OF THE DRAWINGS

These and other features, aspects, and advantages are described below with reference to the drawings, which are intended to illustrate, but not to limit, the invention. In the drawings, like reference characters denote corresponding features consistently throughout similar embodiments.

DETAILED DESCRIPTION

Although certain embodiments and examples are disclosed below, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Electronic devices include many types of devices that send content (e.g., movies, TV shows) to televisions. Electronic devices can include Digital Video Disc (DVD) players, Blu-ray players, digital media extenders, and digital media players such as Apple TV (made by Apple, Inc.), Roku players (made by Roku, Inc.), and Amazon Fire TV (made by Amazon.com, Inc.).

Digital media players often transmit digital signals wirelessly or through a wire such as a High-Definition Multimedia Interface (HDMI) cable to a screen that displays an image based on the digital signal. Screens include computer monitors, televisions, and image-producing portions of movie projectors. As used herein, televisions include flat-panel displays, flat-screen televisions, tube televisions, computer monitors, and other electronic displays that are capable of showing videos. As used herein, "television" is used in a very broad sense.

Owners of digital media players may prefer to mount their digital media players near their screens. For example, a person who owns a flat screen television that is mounted on the wall might want to mount her Apple TV onto her flat screen television or onto the wall behind her flat screen television. Some embodiments described herein enable people to mount their digital media players to their televisions (e.g., to a backside of a television).

Figure 1:
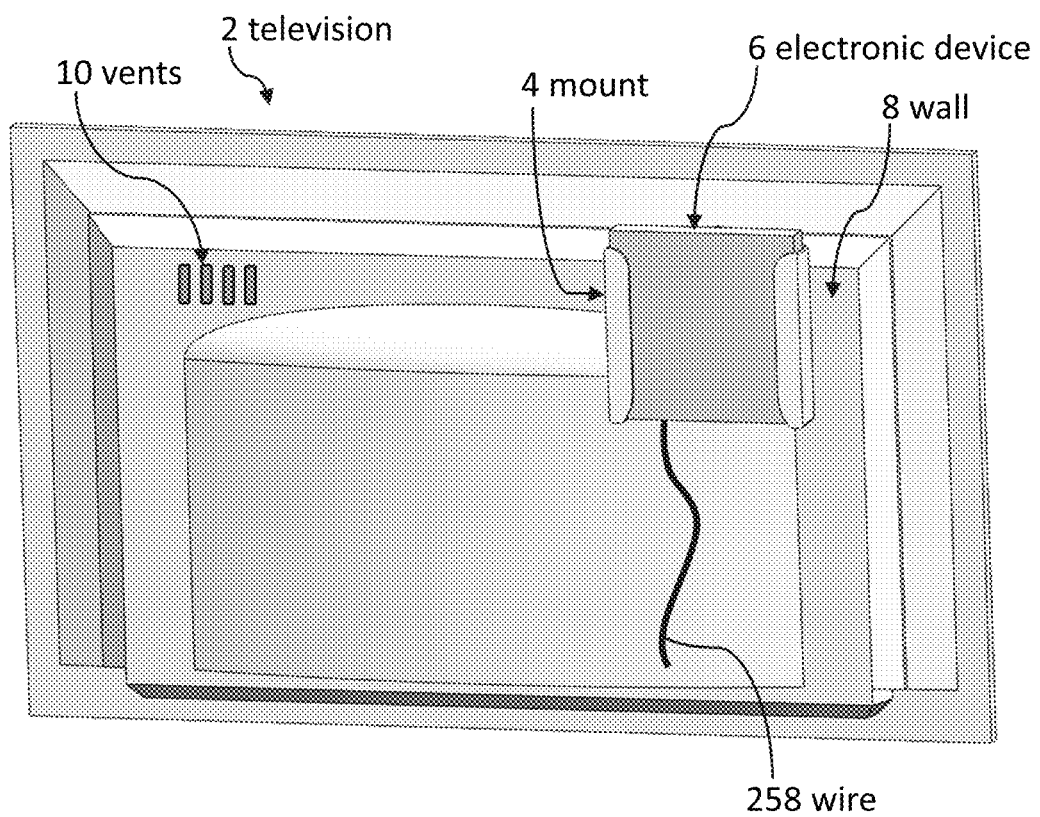
FIG. 1 illustrates a perspective view of a backside of a television, according to some embodiments.

FIG. 1 illustrates a perspective view of a backside of a television 2. Many televisions include backsides that include diverse surfaces that are oriented at different angles and levels relative to each other. Many of these surfaces are curved. The diverse surfaces on backsides of televisions can complicate mounting electronic devices to the backside of televisions. Moreover, some other types of walls (e.g., walls in buildings such as homes and offices) are not always flat.

A mount 4 can have feet that adapt to irregular surfaces to reliably couple electronic devices to many different wall shapes. Thus, the owner does not have to precisely measure surface angles and sizes to create the necessary inputs for a custom mount, but instead, can use the adaptive behavior of the mount 4 to attach an electronic device 6 (e.g., a digital media player) to a wall 8.

Figure 2:
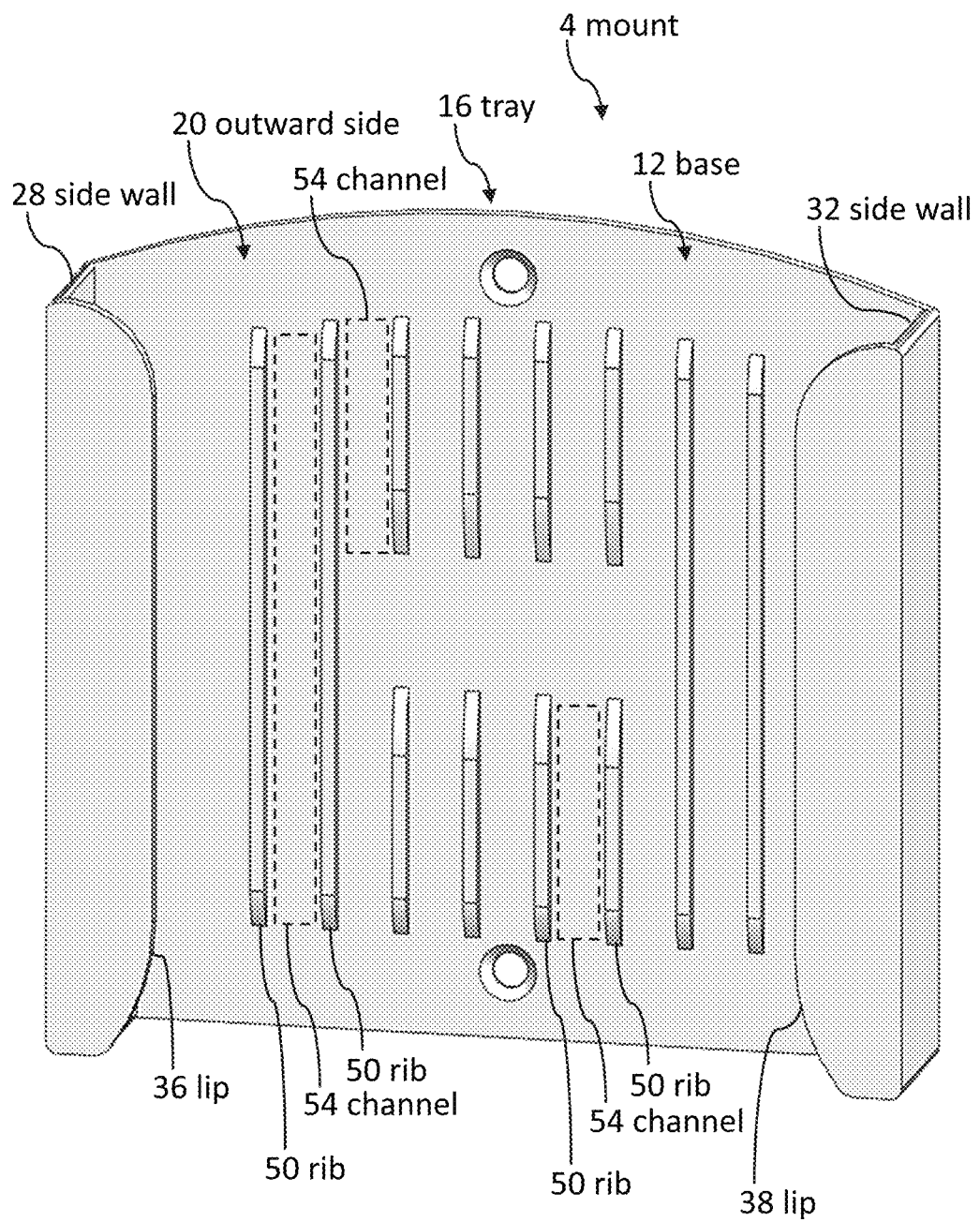
FIGS. 2 and 3 illustrate perspective views of a mount, according to some embodiments.

FIG. 2 illustrates a perspective view of a mount 4, which includes a base 12. As used herein, a tray is a base with at least one side wall. The mount 4 is configured to hold an electronic device (e.g., the electronic device 6 shown in FIG. 1, an Apple TV, a Roku player, an Amazon Fire TV, a wireless router).

Figure 3:
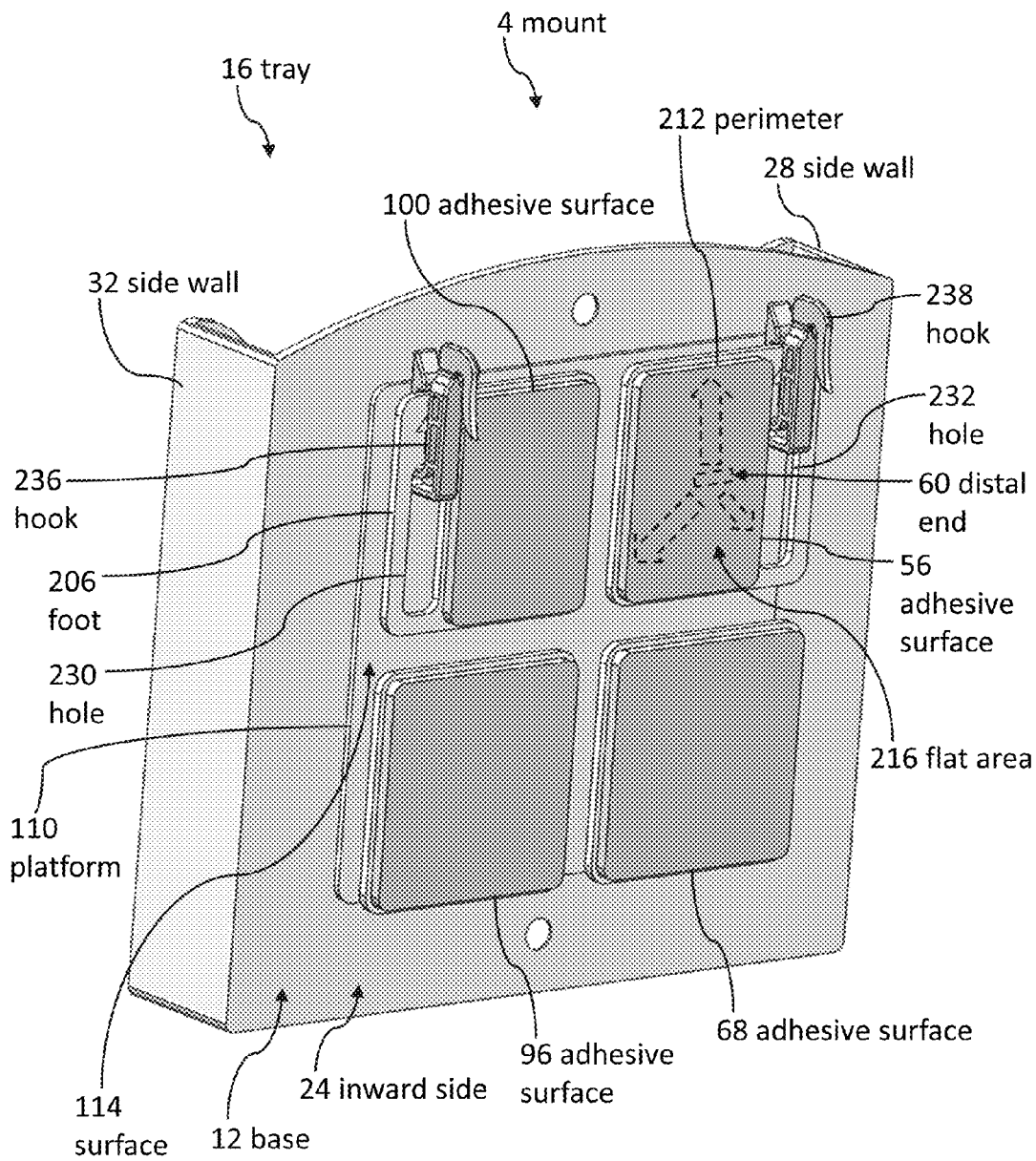

The base 12 includes an outward side 20 and an inward side 24 (shown in FIG. 3). A first side wall 28 protrudes outward from the outward side 20 of the base 12. A second side wall 32 protrudes outward from the outward side 20 of the base 12. A first lip 36 can be coupled to the first side wall 28 and a second lip 38 can be coupled to the second side wall 32. The first lip 36 can protrude towards the second lip 38 and towards the second side wall 32. The second lip 38 can protrude towards the first lip 36 and towards the first side wall 28. The lips 36, 38 can be configured to wrap at least partially around the electronic device 6 (shown in FIG. 1) to couple the electronic device 6 to the mount 4.

The base 12 illustrated in FIG. 2 is flat, such that portions of the mount 4 are flat while other portions of the mount 4 are not flat. The first side wall 28 and the second side wall 32 can be configured to couple an electronic device to the base 12.

Figure 4:
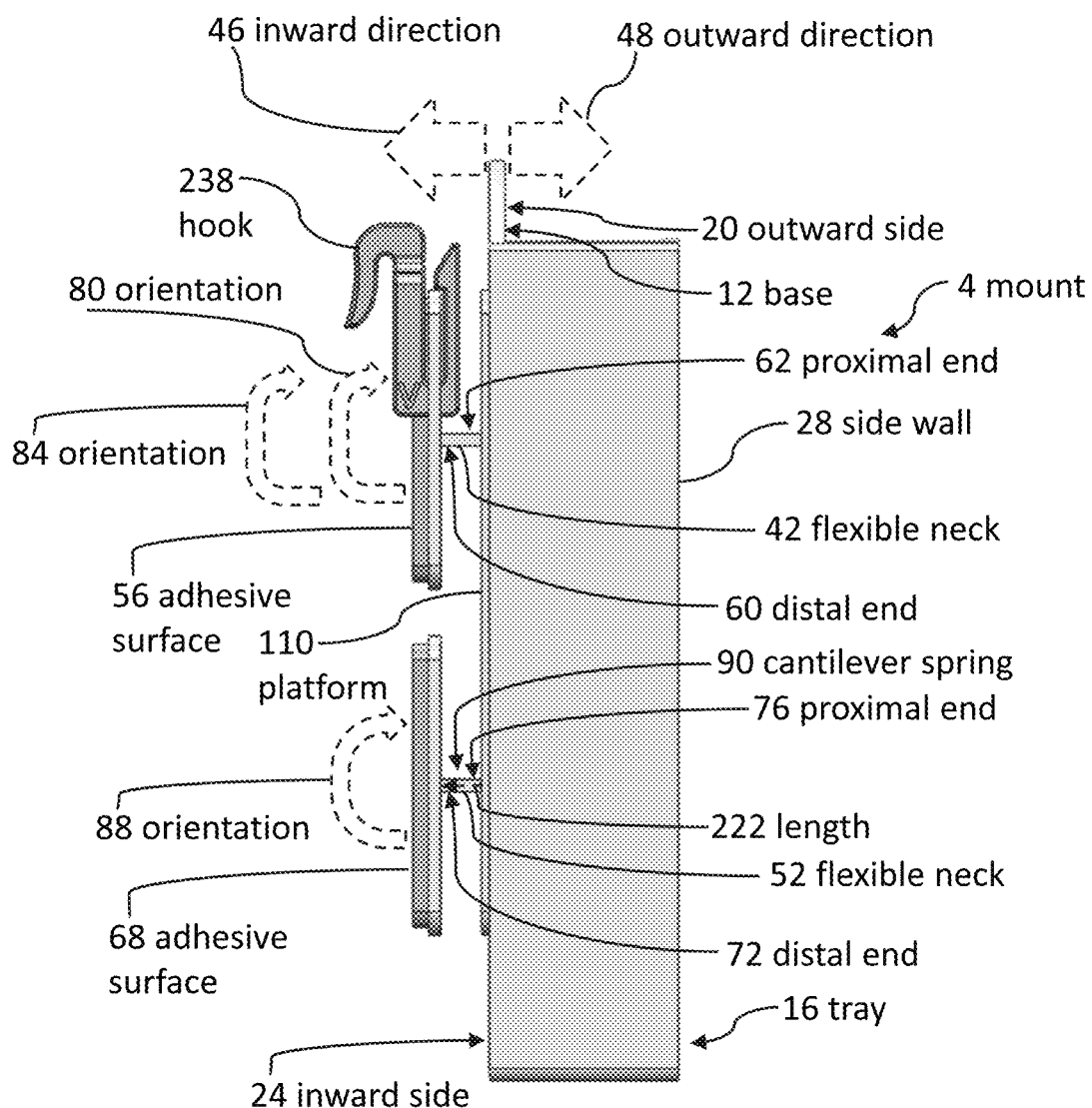
FIG. 4 illustrates a side view of a mount, according to some embodiments.
Figure 5:
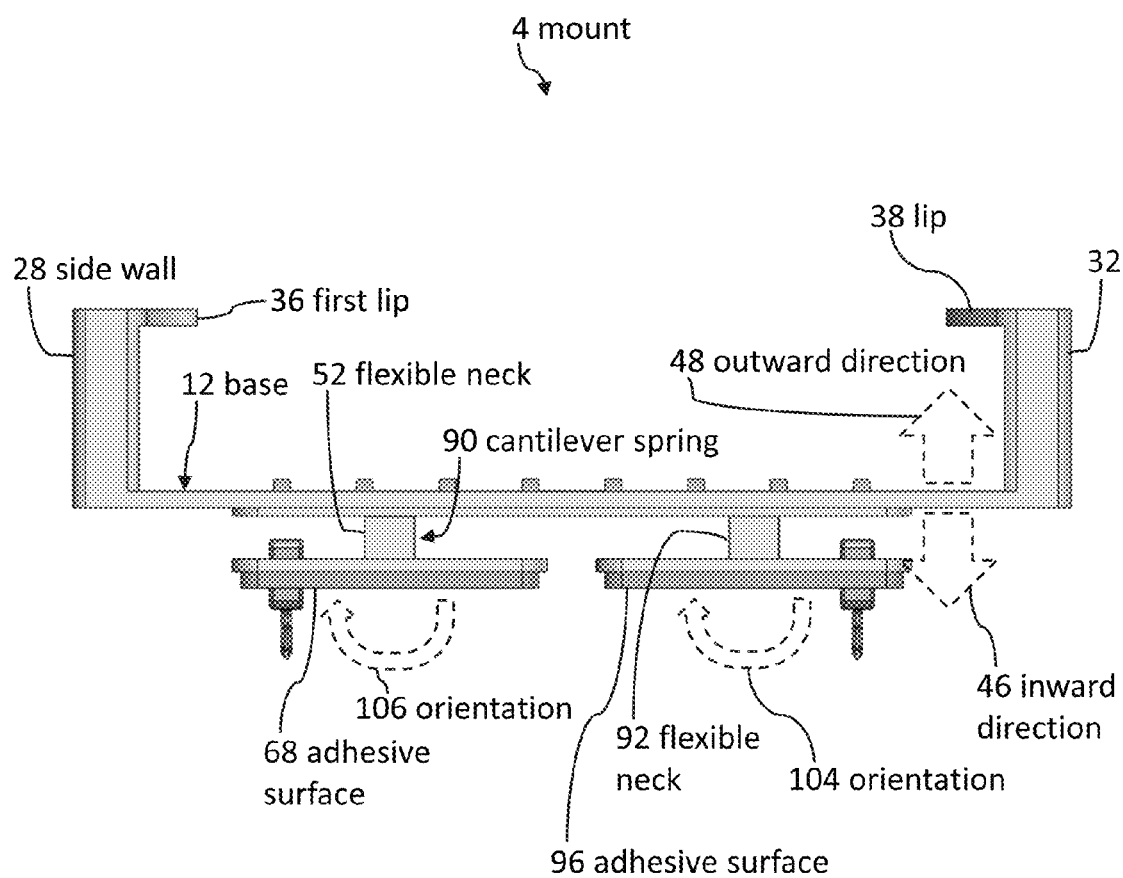
FIGS. 5 and 6 illustrate a bottom view of a mount, according to some embodiments.

FIG. 3 illustrates a perspective view of an inward side 24 of the mount 6. FIG. 4 illustrates a first side view of the mount 4 (the second side view being a mirror image of the first side view). FIG. 5 illustrates a bottom view of the mount 4.

Referring now to FIGS. 3-5, the mount 4 includes a first flexible neck 42 that protrudes inward from the inward side 24 of the base 12. Dashed arrows illustrate an inward direction 46 (e.g., towards a wall to which the mount 4 is attached) and an outward direction 48 (e.g., away from the wall to which the mount 4 is attached). When an electronic device is placed inside the mount 4, the necks 52, 92 can protrude inward (e.g., away from the electronic device).

The first flexible neck 42 can couple the flat base 12 to a first flat adhesive surface 56. The first flexible neck 42 can have a first distal end 60 and a first proximal end 62. The first proximal end 62 of the first flexible neck 42 can be coupled to the inward side 24 of the base 12. The first distal end 60 of the first flexible neck 42 can be coupled to the first flat adhesive surface 56.

The mount 4 can include a second flexible neck 52 that protrudes inward from the inward side 24 of the base 12. The second flexible neck 52 can couple the base 12 to a second flat adhesive surface 68. The second flexible neck 52 can have a second distal end 72 and a second proximal end 76. The second proximal end 76 of the second flexible neck 52 can be coupled to the inward side 24 of the base 12, which can be flat. The second distal end 72 of the second flexible neck 52 can be coupled to the second flat adhesive surface 68. The proximal ends 62, 76 of the necks 42, 52 are coplanar in FIG. 4.

In the embodiment illustrated in FIG. 4, the first distal end 60 of the first flexible neck 42 and the second distal end 72 of the second flexible neck 52 are movably coupled to each other such that the first flexible neck 42 and the second flexible neck 52 are configured to flex independently of each other to change an orientation 80 of the first adhesive surface 56 relative to the second adhesive surface 68 and/or to change an orientation 84 of the first adhesive surface 56 relative to the base 12 (e.g., relative to the inward side 24).

The second flexible neck 52 can also enable the second adhesive surface 68 to change its orientation 88 relative to the base 12 (e.g., relative to the inward side 24). The independent alterability of the orientations 80, 84, 88 of the first adhesive surface 56 and the second adhesive surface 68 can enable the mount 4 to adhere or otherwise attach to curved and irregular walls. Pressing the mount 4 against a curved or irregular surface (e.g., a wall) can force orientations of adhesive pads to adjust to the surface.

The mount 4 can include many adhesive surfaces 56, 68, 96, 100 and many flexible necks 42, 52, and 92. Flexible necks can bend, rotate, and/or move in many directions to move to many different orientations 80, 84, 88, 104, 106. The adhesive surfaces 56, 68, 96, 100 can be foam adhesive pads made by the 3M Company. Adhesive surfaces can be made using the following products made by the 3M Company: doubled-sided foam tape, double-sided polyethylene foam tape with acrylic adhesive, double-sided urethane foam tape with a paper liner, and 3M VHB foam adhesive. Some embodiments use other types of adhesive surfaces.

Items are labeled as "first," "second," "third," and "fourth" in embodiments described herein for illustrative purposes and may be different than the "first," "second," "third," and "fourth" items in the claims. For example, an item labeled "third" in an embodiment described herein may be a "second" item in a claim.

Referring now to FIG. 3, the mount 4 can include a platform 110 that protrudes inward from the inward side 24 of the base 12 (or tray 16). The platform 110 can comprise an inwardly facing surface 114. The inwardly facing surface 114 can comprise a surface area that is greater than a combined surface area of all adhesive surfaces 56, 68, 96, 100 of the mount 4. The platform 110 can couple at least one flexible neck to the base 12 (shown in FIG. 4). In some embodiments, the platform 110 couples one, two, three, four, five, or six necks to the base 12 of the mount 4. The platform 110 can protrude at least 0.2 millimeters, less than 3 millimeters, and/or less than 10 millimeters from the inward side 24 of the base 12.

Referring now to FIG. 4, the distal ends 60, 72 can be rigidly coupled to an adhesive surface 58, 68. The proximal ends 62, 76 can be rigidly coupled to the mount 4, the tray 16, the platform 110, and/or the inward side 24. For example, the proximal ends 62, 76 can be immobile relative to the platform 110 and/or the inward side 24 while the necks 42, 52 bend to enable the adhesive surfaces 56, 68 to move.

The platform 110 can be oriented parallel to at least one adhesive surface 56, 68, 96, 100. In one embodiment, the platform 100 is flat and is oriented parallel to at least two adhesive surfaces while the mount 4 is shipped to a customer.

Figure 7:
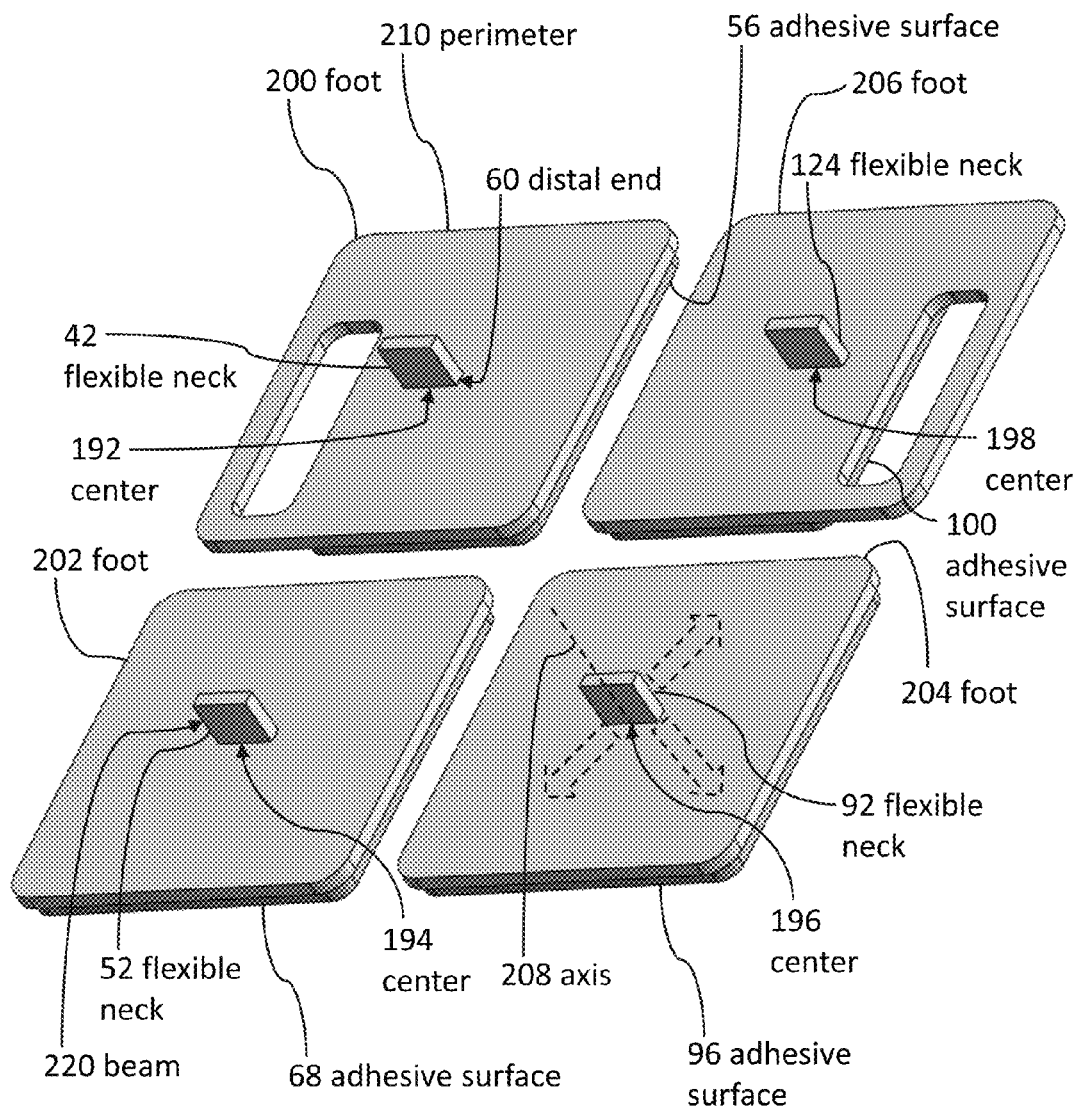
FIG. 7 illustrates a perspective view of a cross section taken along line 7-7 from FIG. 6, according to some embodiments.

In some embodiments, the distal end 60 can be rigidly coupled to the adhesive surface 56 (and/or to the foot 200 shown in FIG. 7) and/or the distal end 72 can be rigidly coupled to the adhesive surface 68 (and/or to the foot 202 shown in FIG. 7). For example, the distal end 60 can be immobile relative at least a portion of the foot 200 while the neck 42 bends to enable the foot 200 to move relative to the base 12.

In some embodiments, at least portions of the adhesive surfaces 56, 68 are perpendicular to the necks 42, 52 that couple the adhesive surfaces 56, 68 to the base 12 or the tray 16. The adhesive surfaces 56, 58 can flex independently, but may be oriented such that they are coplanar (as shown in FIG. 4) during certain times, such as shipping. The adhesive surfaces 56, 68 (or at least portions thereof) may be oriented parallel to the base 12.

In several embodiments, necks 42, 52 protrude perpendicularly relative to the base 12. The adhesive surfaces 56, 68 can be oriented parallel to the base 12 and/or to the tray 16. Besides via the necks 42, 52, the adhesive surfaces 56, 68 can be otherwise unattached to the base 12, the tray 16, and each other. For example, severing the neck 42 can cause the adhesive surface 56 to become detached from the base 12 and the tray 16.

FIG. 4 illustrates an embodiment wherein the base 12 comprises a first half and a second half. One neck 42 is coupled to the first half and another neck 52 is coupled to the second half.

The distal end 60 of the flexible neck 42 protrudes perpendicularly from the adhesive surface 56. The adhesive surface 56 comprises a perimeter. The adhesive surface 56 is coupled to the tray 16 via the neck 42, but the adhesive surface 56 is otherwise unattached to the tray 16 such that the perimeter of the adhesive surface 56 protrudes radially away from the distal end 60 of the flexible neck 42 (shown in FIG. 7).

Figure 6:
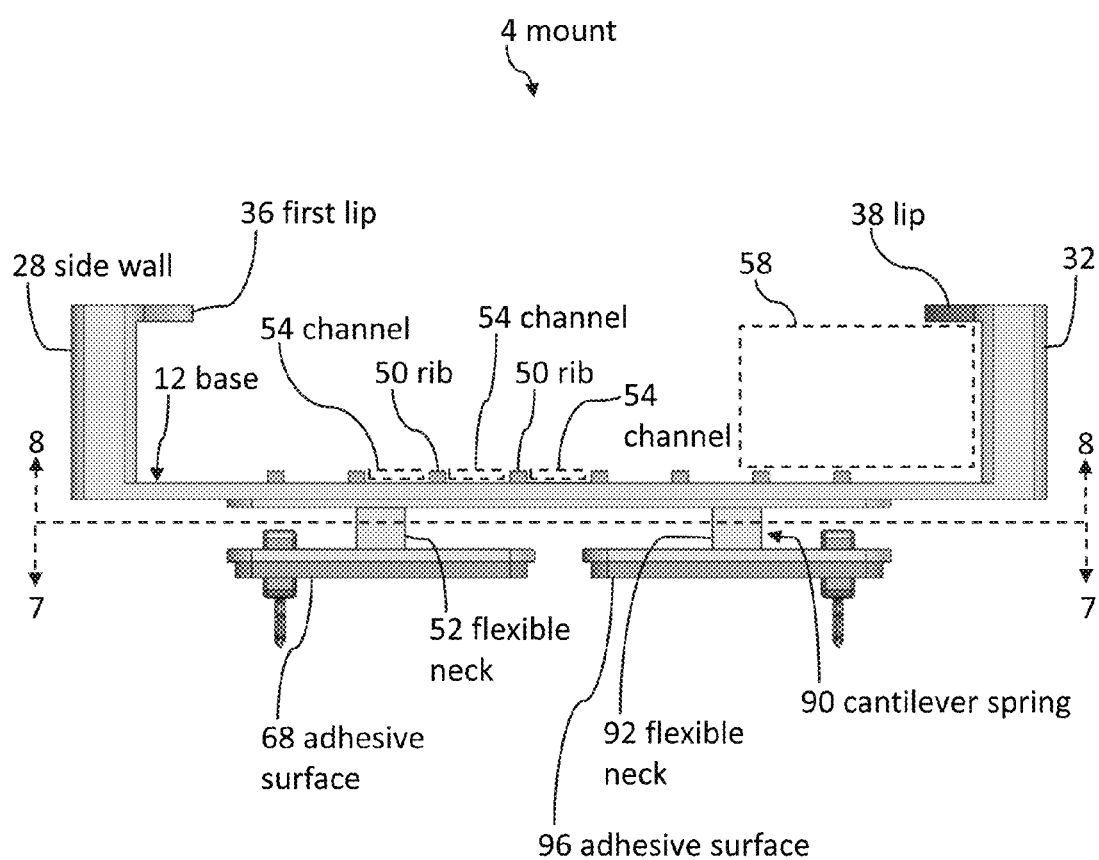

FIG. 6 illustrates the same bottom view as FIG. 5 (with certain labels omitted to increase the clarity of the cross sectional lines). FIG. 6 illustrates ribs 50 that protrude outward from the flat base 12 to form ventilation channels 54 between the ribs 50. Not all the ventilation channels and ribs are labeled in FIG. 6 to increase the clarity of several features. Several example channels 54 are labeled as dashed boxes. Some of the channels 54 and ribs 50 are labeled in FIG. 2.

Ventilation channels 54 can be capable of enabling air to flow between the electronic device 6 (shown in FIG. 1) and the flat base 12. Several embodiments include many ribs 50 and multiple ventilation channels 54. Ribs 50 can protrude perpendicularly from the flat base 12 (e.g., can protrude perpendicularly outward). FIG. 2 illustrates ribs 50 oriented parallel to the first side wall 28 and to the second side wall 32. The ribs 50 can be spaced at least 3 millimeters and/or less than 20 millimeters apart.

The electronic device 6 can rest on top of the ribs 50 (e.g., the electronic device 6 can touch the ribs 50 while being located outward relative to the ribs 50). Dashed box 58 represents a portion of the electronic device 6 (from FIG. 1) coupled to the mount 4. The dashed box 58 illustrates how the ribs 50 can create a ventilation channel between the electronic device 6 and the base 12.

In some embodiments, the channels 54 can be at least five times wider than the ribs 50 (where width is measured from one rib to an adjacent rib). The channels 54 can be 1 millimeter to 10 millimeters deep (wherein depth is measured from the outward surfaces of the ribs that form that channel to the base). The channels 54 can have a flat, planar floor. The channels 54 can be curved.

FIG. 7 illustrates a perspective view of a cross section taken along line 7-7 in FIG. 6. Several embodiments include a third flexible neck 92 and a fourth flexible neck 124. Each neck can include a distal end and a proximal end.

FIG. 7 illustrates necks 42, 52, 92, 124 coupled to center portions 192, 194, 196, 198 of feet 200, 202, 204, 206. For example, the neck 42 is coupled to the center of the foot 200, which in the illustrated embodiment, makes the neck 42 coupled to the center of the adhesive surface 56. (In the illustrated embodiment, the center 192 is the center of the foot 200 and the center of the adhesive surface 56.) Thus, FIG. 7 illustrates an embodiment in which the distal end 60 (also shown in FIG. 4) of the neck 42 is coupled to the center 192.

The feet 200, 202, 204, 206 extend radially outward (e.g., radially away) from the necks 42, 52, 92, 124. As used herein, "radially outward" is a different direction than an "outward direction." For example, neck 92 extends inward while foot 204 extends radially outward from neck 92 (as depicted by dashed arrows in FIG. 7). The foot 204 extends radially outward from a central axis 208 of the neck 92 and extends radially outward in a direction that is perpendicular to the neck 92. The foot 204 extends radially outward from the neck 92 360 degrees such that the neck 92 is coupled to the foot 204 within an outer perimeter of the foot 204.

The foot 200 extends radially outward from the distal end 60 of the neck 42 such that the distal end 60 of the neck 42 is located within an outer perimeter 210 of the foot 200 and within an outer perimeter 212 (shown in FIG. 3) of the adhesive surface 56.

Referring now to FIG. 3, the adhesive surface 60 can extend radially outward from a distal end 60 of the neck 42 (e.g., relative to a distal end of the neck) shown in FIG. 4. The distal end 60 is hidden in FIG. 3, but the location of the distal end 60 is represented by a dashed box. The adhesive surface 56 extends radially outward in all directions that are perpendicular to the distal end 60 of the neck 42 to form a flat adhesion area 216. Dashed arrows in FIG. 3 represent some of the directions in which the adhesive surface 60 extends radially outward. The distal end 60 of the neck 42 (shown in FIG. 4) is coupled within the outer perimeter 212 of the adhesion area (e.g., the adhesive surface 56). As used herein, coupled within the outer perimeter includes embodiments in which an item is coupled within the shadow of the outer perimeter (i.e., within a volume stretching from the outer perimeter directly towards the inward side 24 of the base 12).

In the embodiment illustrated in FIG. 7, each neck 42, 52, 92, 124 comprises a bendable beam (e.g., beam 220) with a rectangular cross section. The bendable beam can enable the neck to be flexible. As used herein, a neck can have a rectangular cross section even if the corners of the cross section (e.g., the edges of the beam) are rounded.

In some embodiments, the beam has a circular cross section such that the beam is cylindrical and can flex to enable a foot (or an adhesive surface) to change its orientation to conform to curved or irregular wall surfaces.

The neck 52 is a rectangular beam that comprises a length, a thickness, and a first width. As used herein, neck length 222 is measured along the central axis of the neck in a direction from the inward side 24 to the adhesive surface 68 (shown in FIG. 4). Neck width is measured perpendicularly to neck length 222. In FIG. 4, neck thickness is measured from the bottom of the page to the top of the page. In FIG. 4, neck width is measured into the page. Neck length, neck thickness, and neck width are measured such that they are all perpendicular relative to each other. Neck thickness is measured such that it results in the smallest possible measurement that is perpendicular to neck length. Neck thickness is measured such that neck thickness is less than or equal to neck width.

In some embodiments, neck length can be at least 2 millimeters, at least 4 millimeters, and/or less than 13 millimeters. The neck width can be at least twice as large as the neck thickness. The neck width can be at least three times as large as the neck thickness.

In some embodiments, a first neck can have a length that is within 10% of the length of a second neck. A first neck can have a width that is within 15% of the width of a second neck. A first neck can have a thickness that is within 20% of the thickness of a second neck. In the embodiment illustrated in FIG. 7, the necks 42, 52, 92, and 124 have equal volume and size (e.g., their lengths, widths, and thicknesses are equal).

Figure 8:
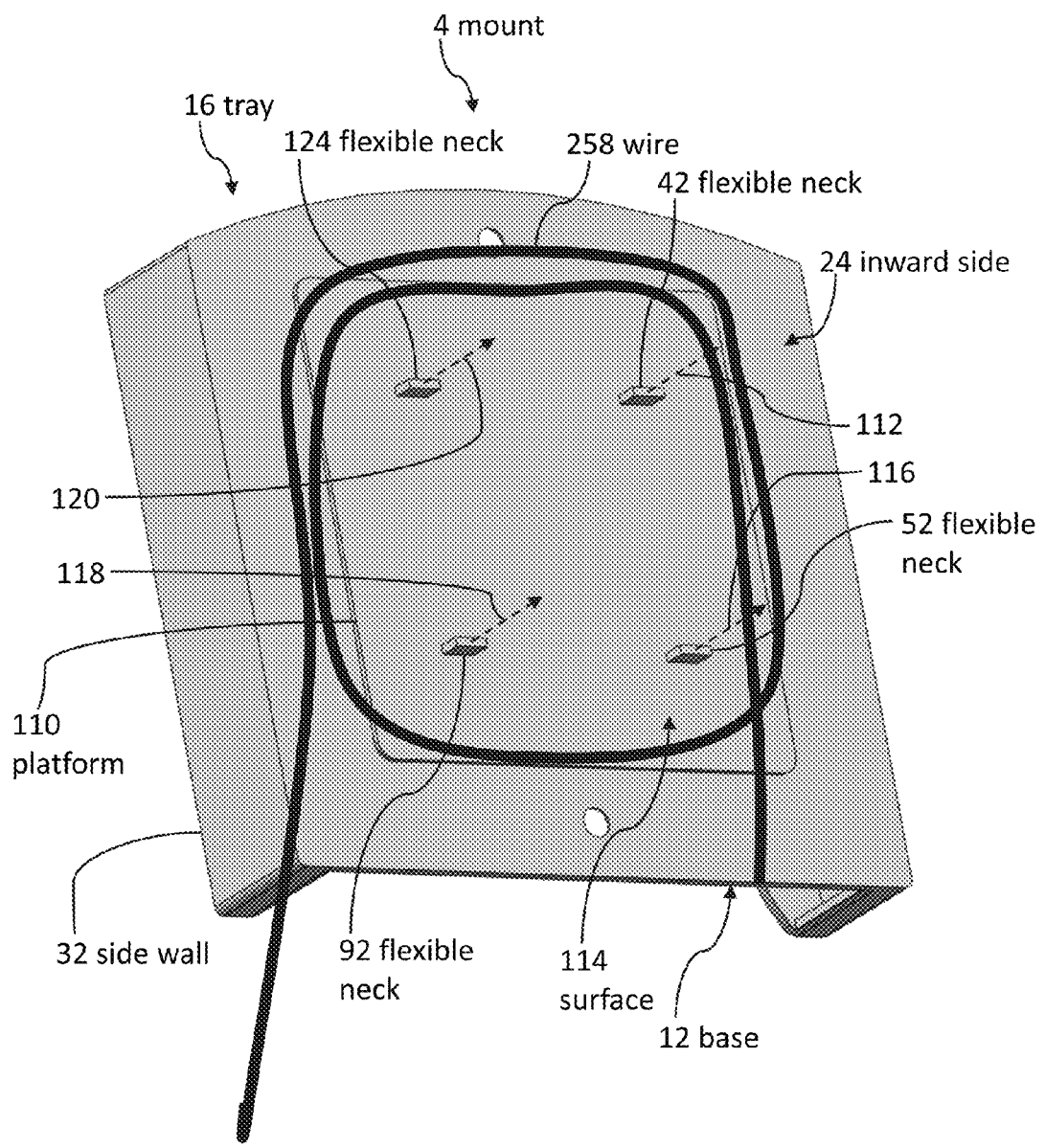
FIG. 8 illustrates a perspective view of a cross section taken along line 8-8 from FIG. 6, according to some embodiments.

FIG. 8 illustrates a perspective view of a cross section taken along line 8-8 in FIG. 6. Dashed arrows 112, 116, 118, 120 indicate central axes of the flexible necks 42, 52, 92, 124. The dashed arrows 112, 116, 118, 120 indicate the directions in which the flexible necks 42, 52, 92, 124 protrude inward from the flat base 12. In the embodiment illustrated in FIG. 8, the central axes of the flexible necks 42, 52, 92, 124 are oriented parallel to each other such that the directions in which the flexible necks 42, 52, 92, 124 protrude inward are parallel. In some embodiments, these directions are within 15 degrees of being parallel to each other.

Adhesive surfaces (e.g., flat adhesive surfaces) can be oriented perpendicularly relative to the dashed arrows 112, 116, 118, 120 (e.g., perpendicularly to a central axis of a flexible neck). For example, FIG. 7 illustrates an adhesive surface 56 that protrudes perpendicularly 360 degrees around the distal end 60 of a flexible neck 42.

Figure 9:
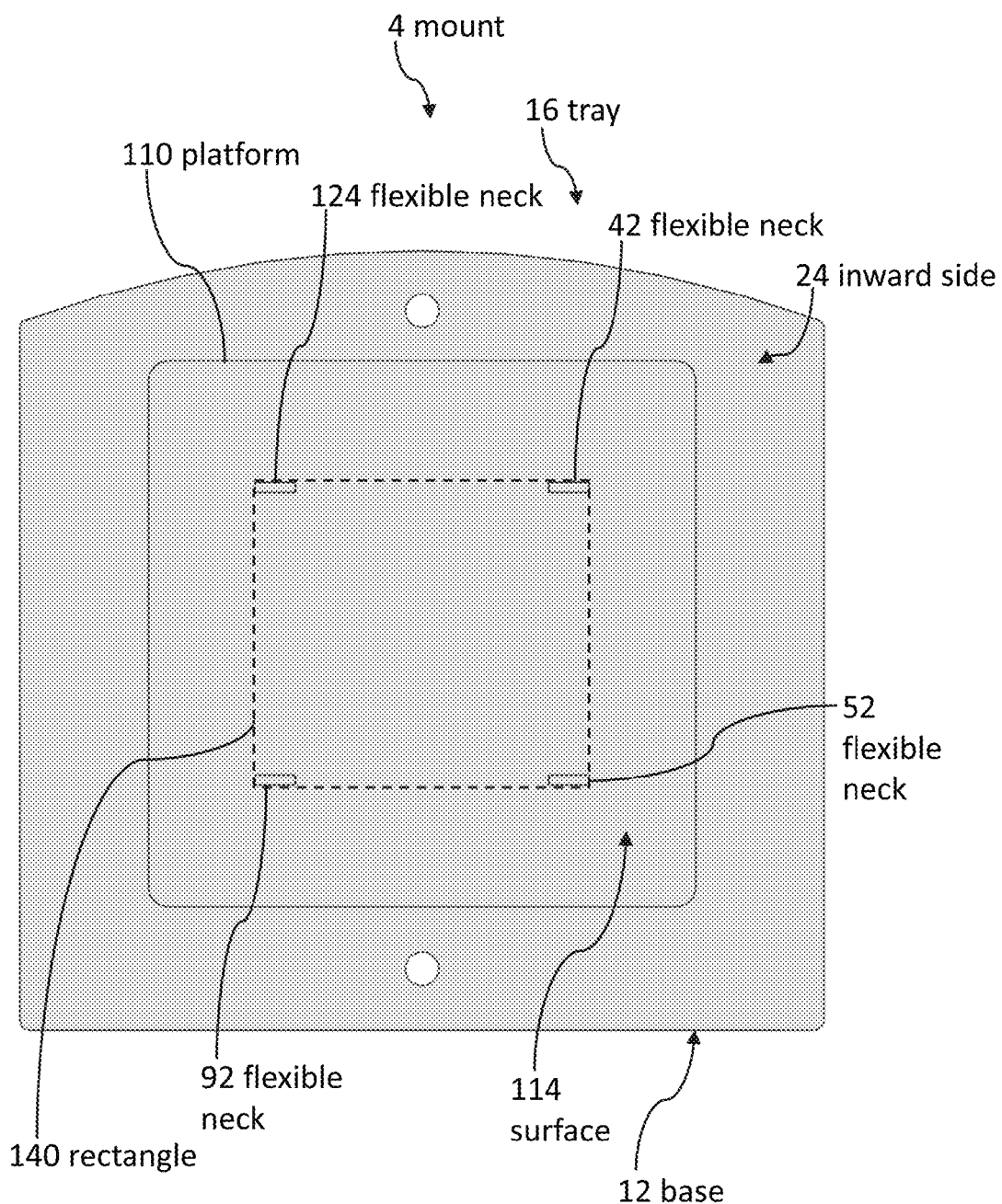
FIGS. 9 and 10 illustrate a back view of the cross section taken along line 8-8 from FIG. 6, according to some embodiments.

FIG. 9 illustrates a back view of the cross section taken along line 8-8 in FIG. 6. In the embodiment illustrated in FIG. 9, the necks, a portion of each neck, and the proximal ends of the necks are located in a rectangular configuration relative to each other. For example, the necks 42, 52, 92, 124 can be located at corners of an imaginary rectangle 140. A square configuration is one type of rectangular configuration.

Figure 10:
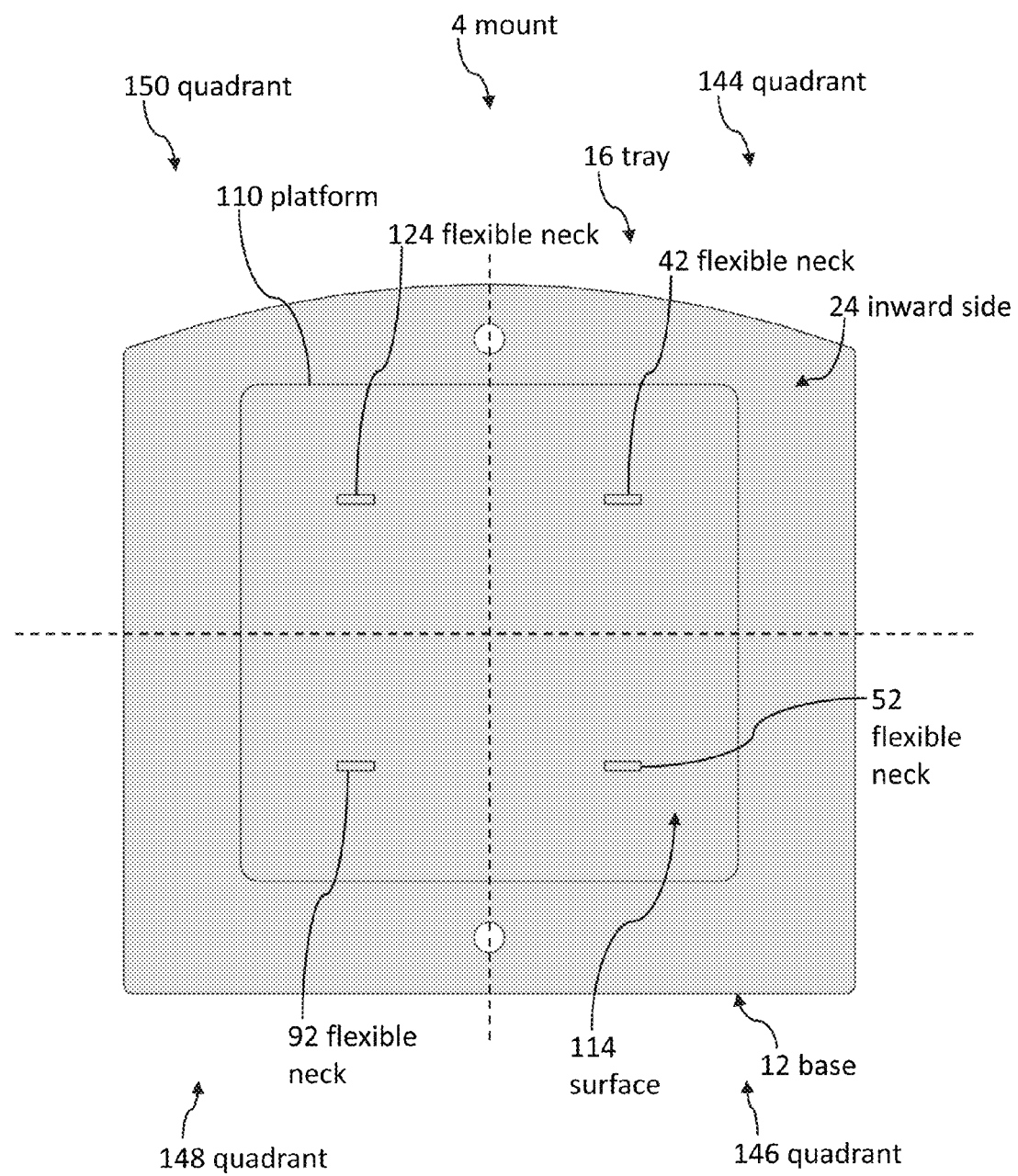

FIG. 10 illustrates the same view as FIG. 9 (with some labels omitted to clarify the quadrants). Dashed lines separate the mount 4 into quadrants 144, 146, 148, 150. The mount 4 can include quadrants 144, 146, 148, 150 with a flexible neck attached to each quadrant of the mount 4. In some embodiments, a base 12 (or tray 16) comprises a first quadrant 144, a second quadrant 146, a third quadrant 148, and a fourth quadrant 150. A first flexible neck 42 can be coupled to the first quadrant 144, a second flexible neck 52 can be coupled to the second quadrant 146, a third flexible neck 92 can be coupled to the third quadrant 148, and a fourth flexible neck 124 can be coupled to the fourth quadrant 150.

Figure 11:
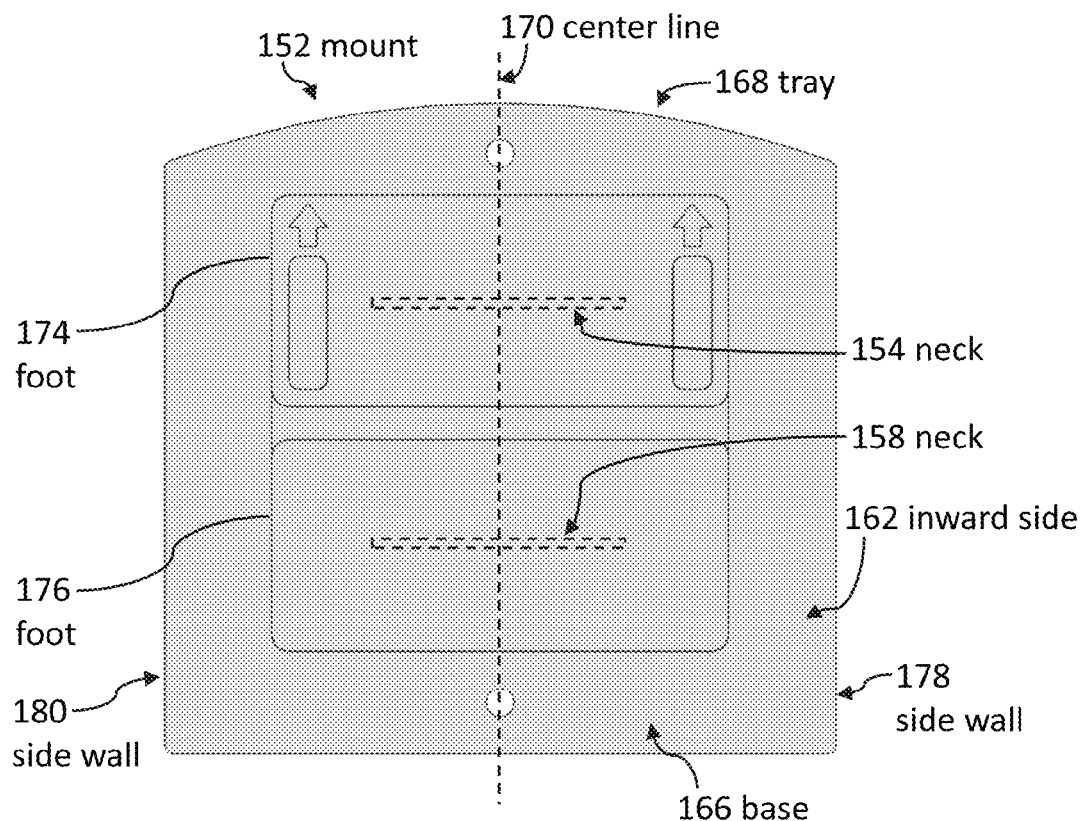
FIG. 11 illustrates a back view of a mount with two flexible necks, according to some embodiments.

FIG. 11 illustrates a back view of an embodiment of a mount 152 with two flexible necks 154, 158 coupled to the base 166 (or tray 168) along a center line 170 of the base 166. The necks 154, 158 are hidden by the feet 174, 176 of the mount 152. FIG. 11 uses dashed lines to show the location of the necks 154, 158 under the feet 174, 176. A foam adhesive pad is attached to each foot 174, 176.

Figure 12:
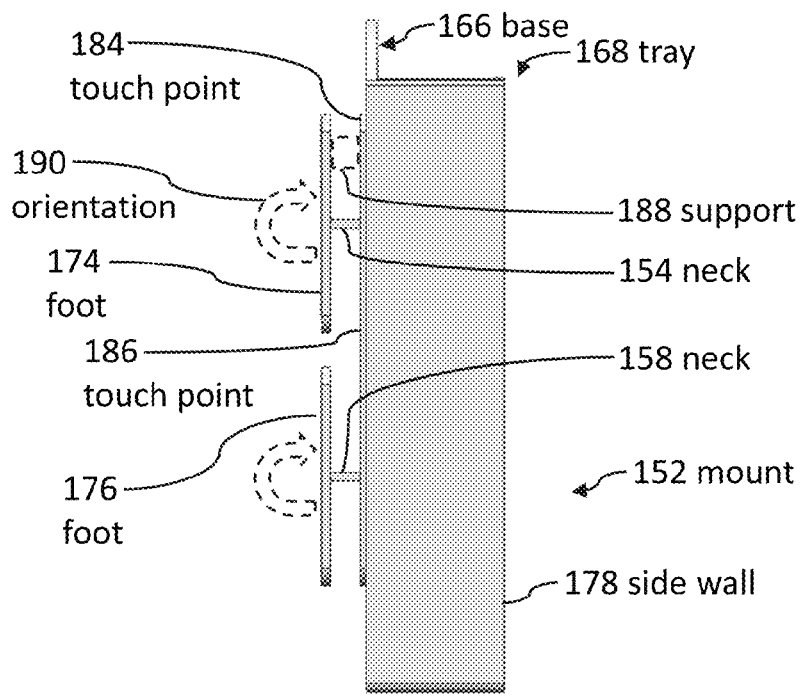
FIG. 12 illustrates a side view of the mount illustrated in FIG. 11, according to some embodiments.

FIG. 12 illustrates a side view of the embodiment illustrated in FIG. 11. In the embodiment illustrated in FIGS. 11 and 12, the center line 170 is located halfway between a first side wall 178 and a second side wall 180. The first flexible neck 154 is located a first normal distance from the first side wall 178 and a second normal distance from the second side wall 180. The second flexible neck 158 is located the first normal distance from the first side wall 178 and the second normal distance from the second side wall 180. Normal distance can be measured in a direction normal to the sidewall (directly towards a neck).

The necks 154, 158 have rectangular cross sections and are box-shaped beams. In many embodiments, necks (e.g., flexible necks) have circular cross sections and are cylinders that allow a foot with an adhesive surface to bend in many different directions. In several embodiments, a neck is flexible because it allows a foot and/or an adhesive surface to move to different orientations relative to a tray, a base, or other portions of a mount (e.g., portions of the mount located outwardly relative to the neck). Flexible necks can be bendable necks.

A neck that is flexible enables a foot with an adhesive surface to change its orientation relative to the tray. Many materials can enable a neck to be flexible. For example, acrylonitrile butadiene styrene (ABS) plastic can be used to mold a neck. In some embodiments, plastic is used to form a neck that is not so brittle that the neck breaks (i.e., is severed) when moved up to three times between a maximum upward position and a maximum downward position. For example, in FIG. 12 the foot 174 can be rotated upward such that it touches the base 166 at an upward maximum point 184 and can be rotated such that it touches the base 166 at a downward maximum point 186.

Bonding a support 188 between the base 166 and the foot 174 could prevent the neck 154 from being flexible because the support 188 could prevent the neck 154 from bending. The embodiment illustrated in FIG. 12 does not include the support 188 to enable the neck 154 to bend to change an orientation 190 of the foot 174 relative to the base 166. In several embodiments, the orientation 190 of the foot 174 relative to the base 166 (e.g., relative to the inward side 162) can change (e.g., in at least one direction) at least 10 degrees, at least 20 degrees, at least 25 degrees, and/or less than 30 degrees.

Figure 13:
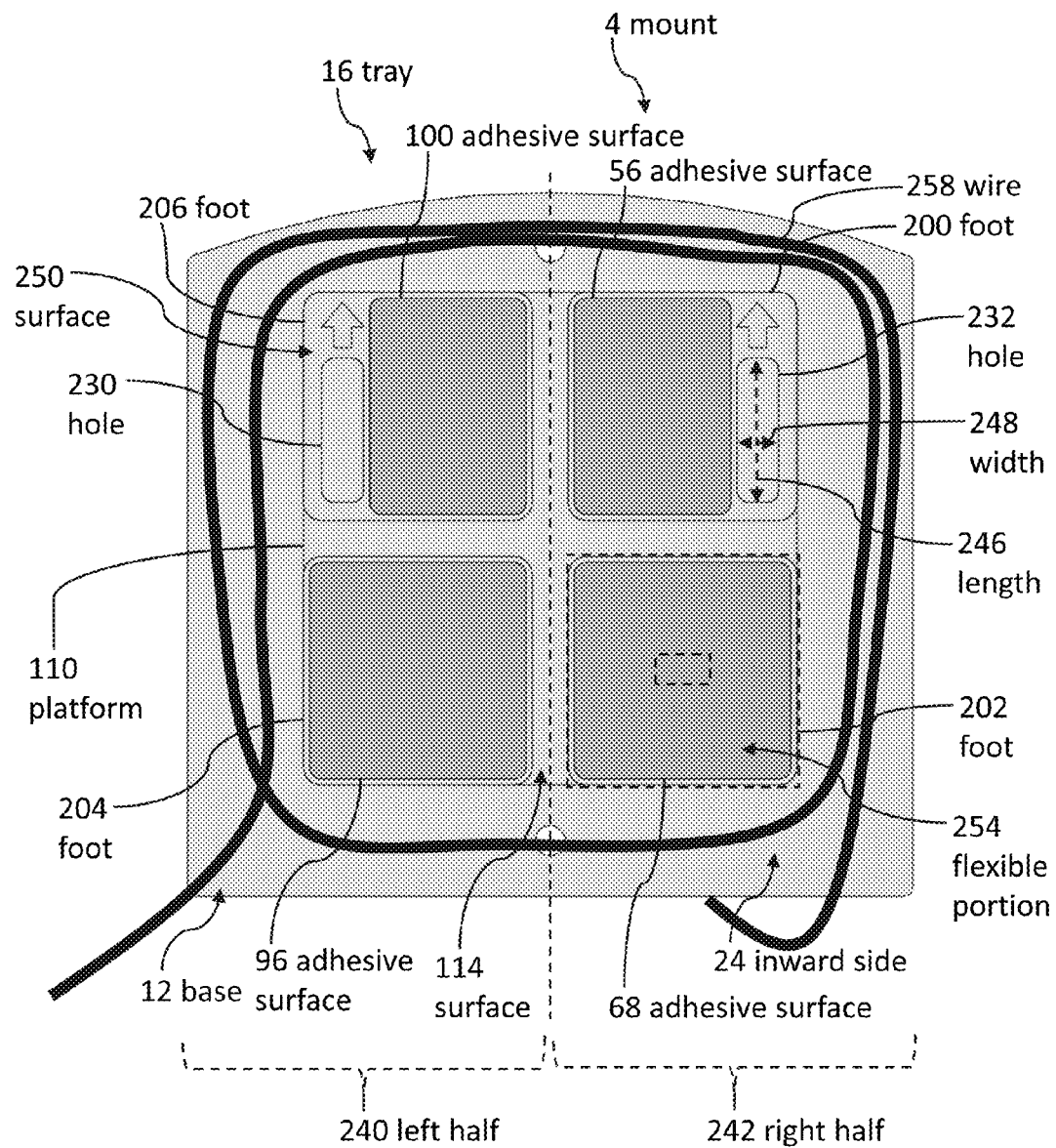
FIG. 13 illustrates a back view of the mount from FIG. 3, according to some embodiments.

FIG. 13 illustrates a back view of the mount 4 from FIG. 3. The foot 206 includes a hole 230 that is shaped like a slot. The hole 230 is oriented outward towards the tray 16 (i.e., oriented towards the inward side 24). The hole 230 can be oriented parallel to the side wall 32 (shown in FIG. 3). The foot 206 also includes an adhesive surface 100 that faces inward (as indicated by the inward direction 46 in FIG. 4). A hook 236 can be removably coupled to the hole 230 and can be oriented parallel to the side wall 32 (as shown in FIG. 3). A hook 238 (shown in FIG. 3) can be coupled to the hole 232 in another foot 200.

The mount 4 includes a left half 240 and a right half 242. The first hole 230 can be located on the left half 240 and the second hole 232 can be located on the right half 242 of the mount 4. Each slot can be at least three times as long as it is wide (where length 246 is defined as the longest side of the slot and width 248 is defined as perpendicular to the length 246).

The foot 206 comprises a flat, inwardly facing surface 250. The hole 230 and the adhesive surface 100 can be located on the flat, inwardly facing surface 250 of the foot 206.

The foot 202 includes a flexible portion 254 (located between the dashed squares in FIG. 13). The flexible portion 254 is oriented perpendicularly relative to the distal end 72 of the flexible neck 52 (shown in FIG. 4). The flexible portion 254 protrudes perpendicularly 360 degrees around the distal end 72. The flexible portion 252 is configured to bend to enable the adhesive surface 68 to conform to curved shapes (e.g., a curved wall of a building or object such as a television).

The left half 240 of the mount 4 includes one side wall 32 (shown in FIG. 3). The right half 242 of the mount includes another side wall 28 (shown in FIG. 3). In several embodiments, a first flexible neck and a first flat adhesive surface are located on the left half 240, and a second flexible neck and a second flat adhesive surface are located on the right half 242 of the mount 4.

Some embodiments include a wire 258 wrapped around the necks 42, 52, 92, 124 (shown in FIG. 8) and/or around the feet 200, 202, 204, 206. The wire 258 can be located under the tray 16 and base 12 (e.g., the wire 258 can be located inward relative to the tray 16). At least one wrap and/or at least two wraps of the wire 258 can be located between the mount 4 and the wall 8 (shown in FIG. 1). A portion of the wire 258 can be located between the base 12 and the wall 8 (shown in FIG. 1). The wall 8 can be a backside of a television.

The tray 16 includes a first perimeter. A second perimeter is defined by the adhesive surfaces 56, 68, 96, 100. In the embodiment illustrated in FIG. 13, the first perimeter is located radially outside of the second perimeter. The wire 258 is wrapped at least partially between the first perimeter and the second perimeter.

As used herein, "wire" is used in a broad sense and includes cords and cables that conduct electricity (e.g., power cords and HDMI cables). One end of the wire 258 can be plugged into the electronic device 6 (shown in FIG. 1).

Figure 14:
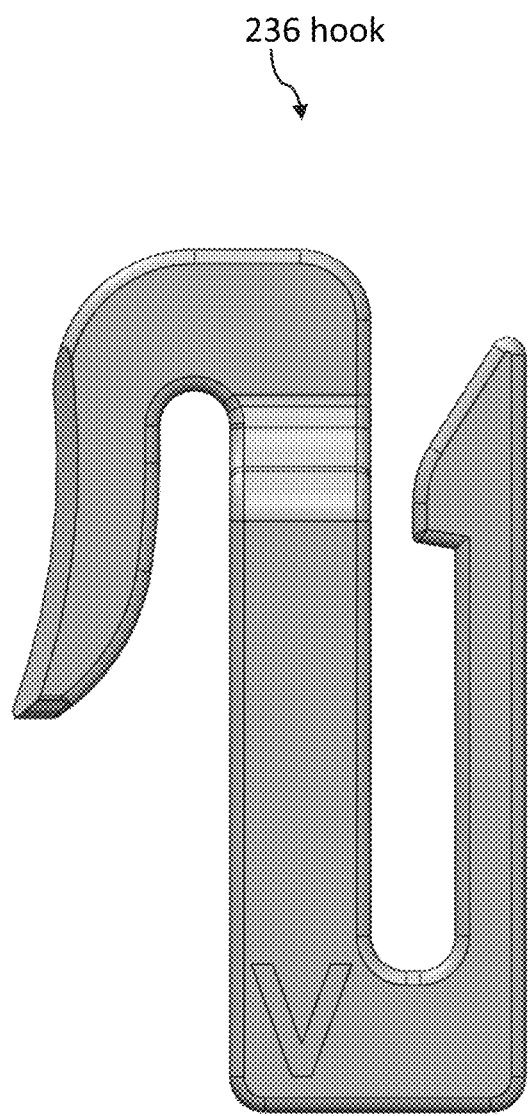
FIG. 14 illustrates a side view of a hook, according to some embodiments.

FIG. 14 illustrates a side view of the hook 236. The hook 236 can be "S" shaped with a portion configured to be located outward relative to the foot 206 and a portion configured to be located inward relative to the foot 206 (shown in FIGS. 3 and 13). The hook 236 can be configured to enter vents 10 on the backside of a television 2 (shown in FIG. 1).

Figure 15:
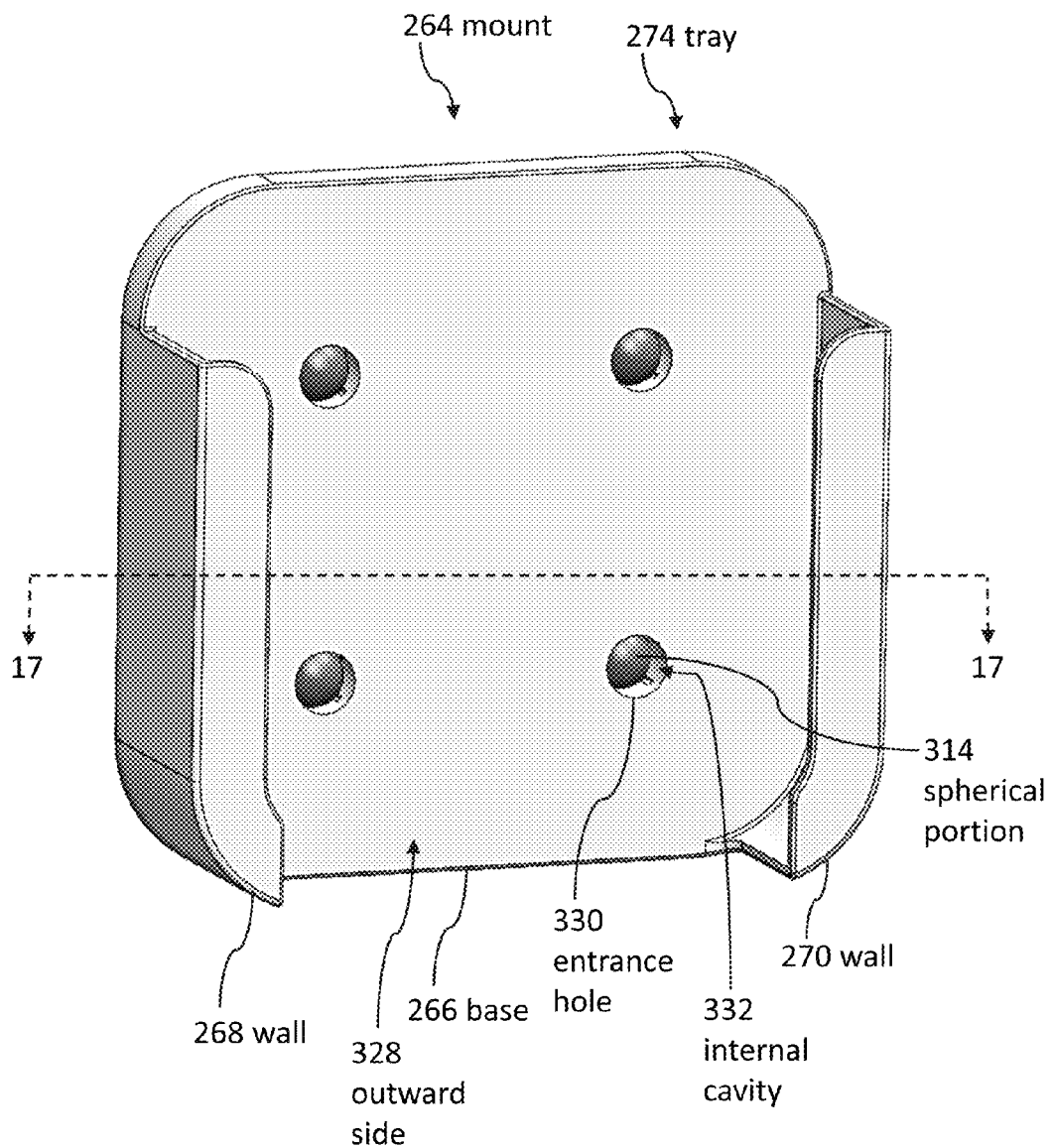
FIG. 15 illustrates a perspective view of a front of a mount with flexible necks, according to some embodiments.

FIG. 15 illustrates a perspective view of a front of a mount 264 with flexible necks. Each neck includes a movable joint. Different embodiments include many different types of movable joints.

The mount 264 includes a base 266 and walls 268, 270. The walls 268, 270 protrude outward from the base 266 to form a tray 274. The mount 264 is configured to hold the electronic device 6 on a wall 8 (shown in FIG. 1). The mount 264 can include adhesive surfaces configured to couple the mount 264 to a backside of a television.

Figure 16:
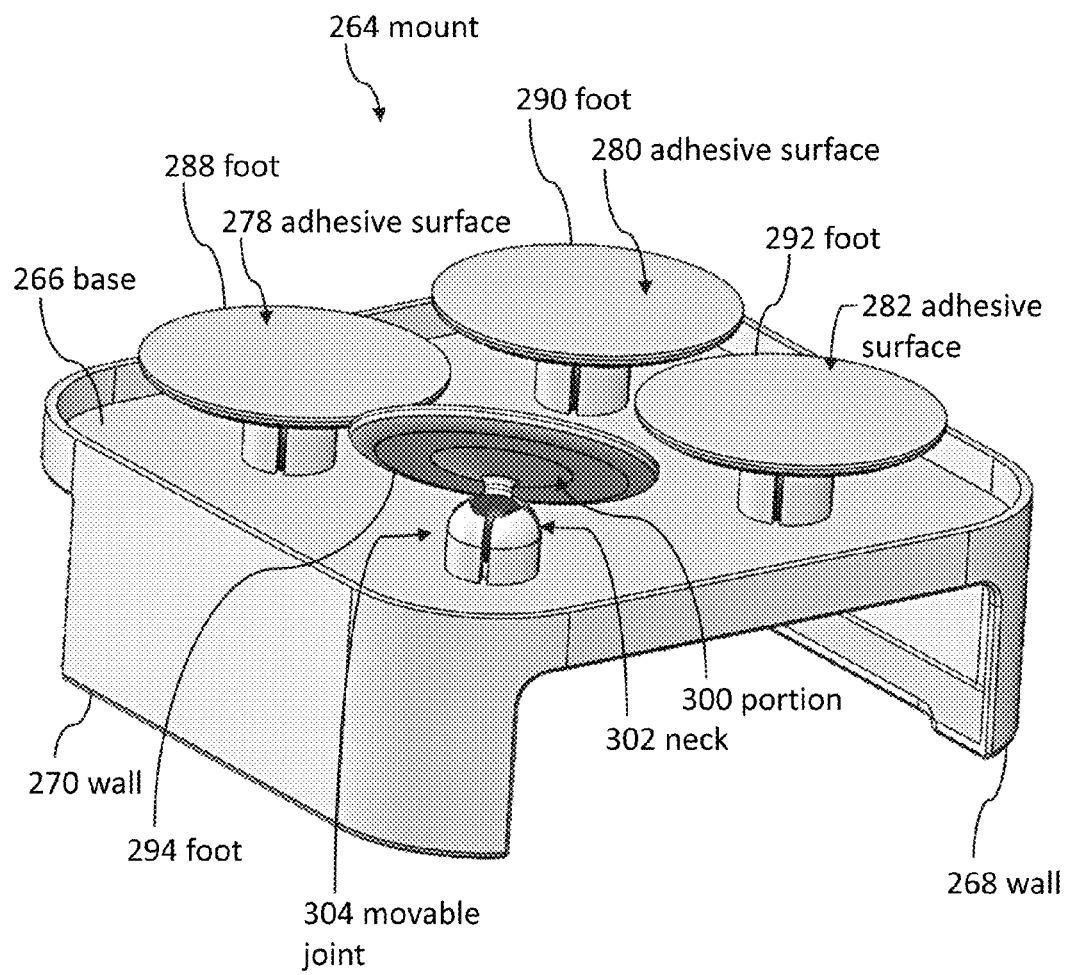
FIG. 16 illustrates a perspective view of a back of the mount from FIG. 15, according to some embodiments.
Figure 17:
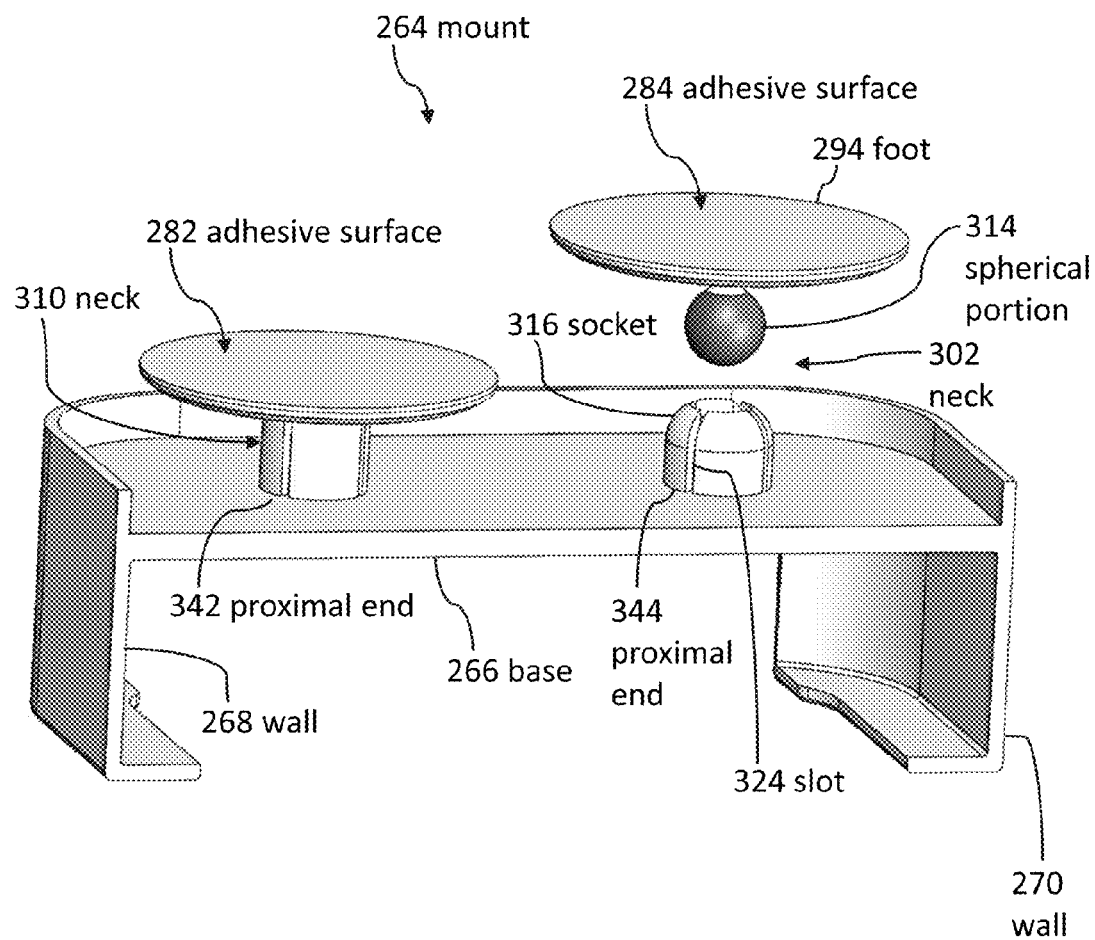
FIG. 17 illustrates a perspective view of a cross section taken along line 17-17 from FIG. 15, according to some embodiments.

FIG. 16 illustrates a perspective view of a back of the mount 264. FIG. 17 illustrates a cross sectional view along line 17-17 from FIG. 15.

Referring now to FIGS. 15-17, the mount includes adhesive surfaces 278, 280, 282, 284 (shown in FIGS. 16 and 17). The adhesive surfaces 278, 280, 282, 284 are located on inwardly facing portions of feet 288, 290, 292, 294. Although in the illustrated embodiment, the inwardly facing portions of the feet 288, 290, 292, 294 are flat, outwardly facing portions of the feet 288, 290, 292, 294 are not flat. For example, outwardly facing portion 300 of foot 294 is not flat.

FIG. 16 illustrates a flexible neck 302 with a movable joint 304 located between a first distal end and a first proximal end of the flexible neck 302. FIG. 17 illustrates another flexible neck 310. The proximal ends 342, 344 of the necks 302, 310 are coplanar. The proximal ends 342, 344 couple the necks 302, 310 to the base 266.

A proximal end of a neck is located closer to a tray than a distal end of the neck. A tray is configured to hold an electronic device (or other item).

FIG. 17 shows an exploded view of the neck 302. The neck 302 includes a ball joint having a spherical portion 314 movably coupled to a socket portion 316. The socket portion 316 can be coupled to the base 266 (or tray 274) and the spherical portion 314 can be coupled to the adhesive surface 284 such that the spherical portion 314 can move relative to the base 266, but the spherical portion 314 is rigidly coupled to the adhesive surface 284. For example, in some embodiments, the spherical portion 314 can rotate relative to the base 266 (or tray 274) but cannot rotate relative to the adhesive surface 284.

The socket portion 316 can comprise at least one slot 324 configured to allow the socket portion 316 to expand to receive the spherical portion 314 (e.g., to push the spherical portion 314 into the socket portion 316). For example, the slot 324 can slice the socket 316 into separate sections that can expand outward when the spherical portion 314 is pressed into the socket 316.

Referring now to FIG. 15, the outward side 328 of the flat base 266 can comprise an entrance hole 330, which forms an internal cavity 332 of the socket portion 316 (shown in FIG. 17). The internal cavity 332 is located inside of the socket portion 316. The internal cavity 332 can be configured to hold the spherical portion 314. The spherical portion 314 is located inside of the internal cavity 332.

The mount 264 can include four movable joints coupled to the tray 274 in a rectangular configuration. Each movable joint can include a spherical portion coupled to a socket portion.

Mounting systems can be molded from many types of plastics. In some embodiments, mounts can be molded from acrylonitrile butadiene styrene (ABS) plastic with a hardness of 90 to 95 Shore A or 55 to 95 Shore D. The hooks can also be molded from ABS plastic materials. The hooks can be molded from polyurethane with a hardness of 70 to 95 Shore A. The hooks can also be molded from silicone rubber with a hardness of 85 Shore A or 95 Shore A.

Mounts can be molded from polyethylene terephthalate (PET), polyurethane (PU), nylon, polypropylene (PP), polyethylene (PE), thermoplastic elastomers (TPE), and many types of rubber materials. Materials for injection molding mounts can be purchased from General Electric Company and Chevron Philips Chemical Company.

Screws can be a metal (such as stainless steel) and can be fabricated through standard screw machining processes. Screws can be inserted through holes in mounts to couple mounts to walls.

Any embodiment described in the context of a base (e.g., a flat base) can be applied to a tray. Any embodiment described in the context of a tray can be applied to a base (e.g., a flat base).

A flat base can be part of a mount with many non-flat portions. For example, non-flat ventilation channels, non-flat necks, non-flat side walls, and/or ribs can be coupled to a flat base to form a mount with many non-flat portions.

Referring now to FIG. 4, the flexible necks 42, 52 enable coordinating the movement of multiple adhesive surfaces 56, 68. The flexible necks 42, 52 allow the adhesive surfaces 56, 68 to work together properly by enabling the adhesive surfaces 56, 68 to spring back to neutral positions (e.g., such that the adhesive surfaces 56, 68 are coplanar to facilitate proper landing on the backside of a television).

As used herein, a spring's neutral position is the spring's rest position when not acted upon by external forces (e.g., when a person is not pressing on an adhesive surface that is coupled to the spring and the spring is not restrained).

Figure 19:
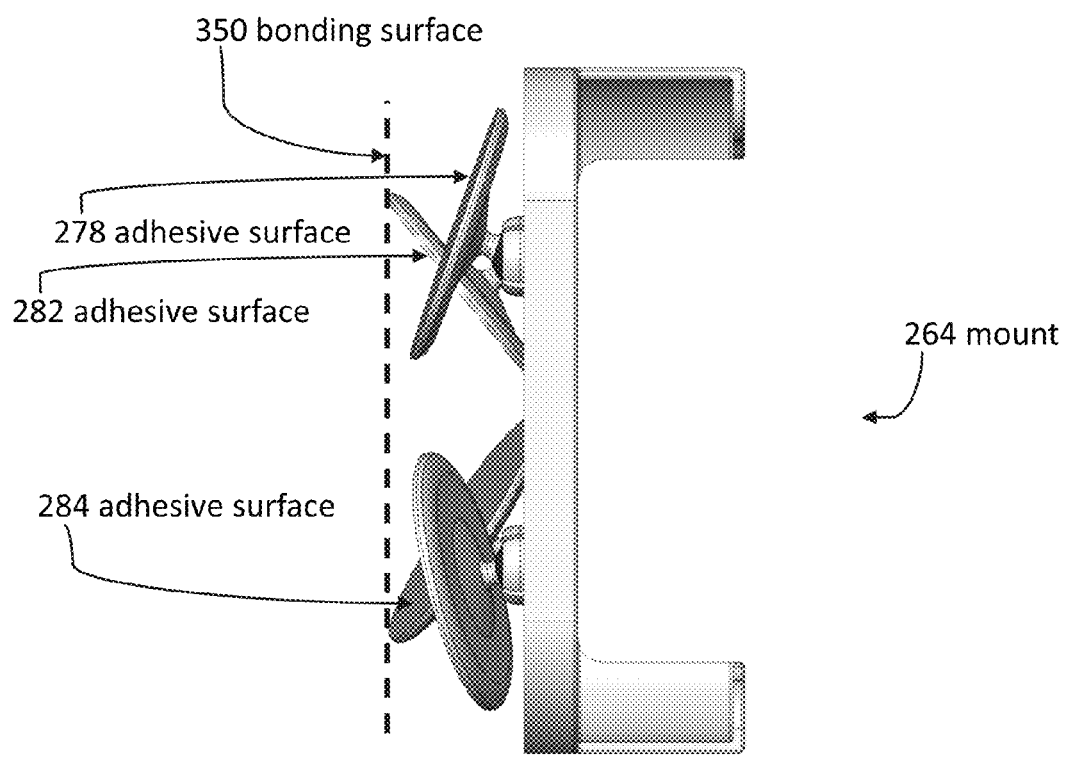
FIG. 19 illustrates a top view of a mount after the mount touches a bonding surface, according to some embodiments.

Embodiments in which the adhesive surfaces do not spring back to neutral positions can lead to the adhesive surfaces touching down on the backside of the television in awkward orientations that interfere with the adhesive surfaces fully bonding with the backside of the television (e.g., as illustrated in FIG. 19).

The flexible necks 42, 52 shown in FIG. 4 are bendable beams. The flexible necks 42, 52 shown in FIG. 4 are also cantilever springs 90. The cantilever springs can be molded plastic. The cantilever springs 90 can be molded with the rest of the mount 4, although in many cases, the adhesive surfaces 56, 68 are added after molding the body of the mount 4.

The proximal ends 62, 76 of the cantilever springs are attached to the inward side 24 of the base 12. The distal ends 60, 72 of the cantilever springs are coupled to the adhesive surfaces 56, 68. The cantilever springs 90 have neutral positions, which can be perpendicular to the base 12.

One advantage of some embodiments of bendable beams is that each bendable beam has a neutral position, which can be designed to control the orientation of multiple necks at once to ensure that necks are not oriented at odd angles relative to each other that could preclude all the adhesive surfaces from simultaneously contacting the backside of the television. This simultaneous contact can be important for proper installation.

Figure 18:
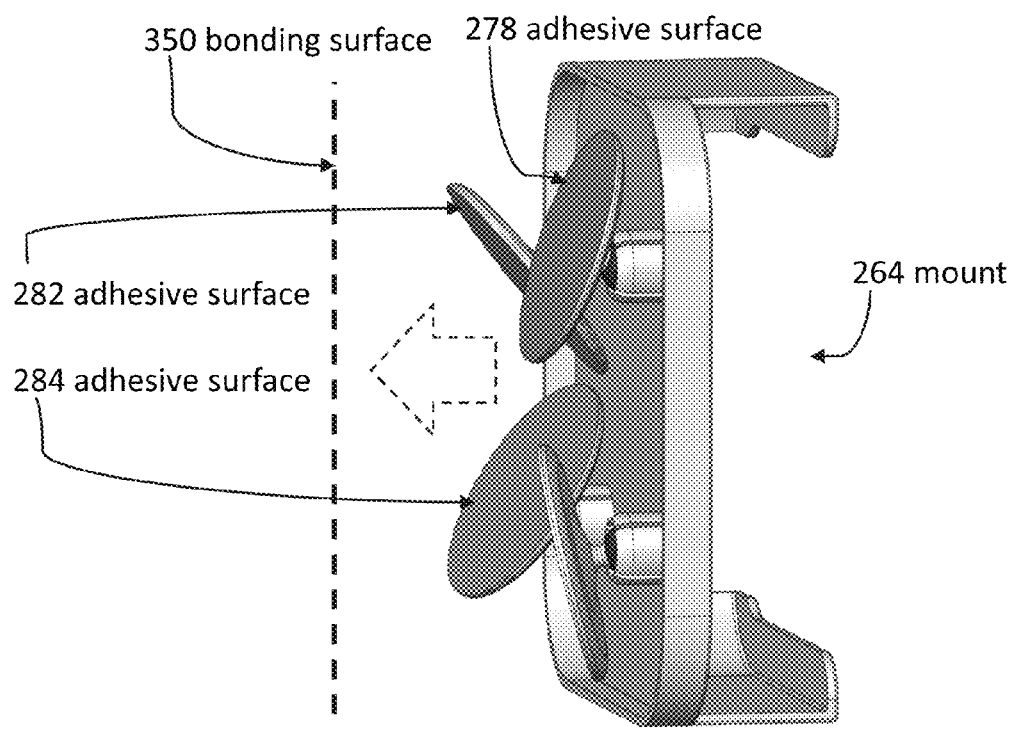
FIG. 18 illustrates a perspective view of a mount just before the mount touches a bonding surface, according to some embodiments.

FIG. 18 illustrates a perspective view of a mount 264 just before the mount 264 touches a bonding surface 350 (e.g., a backside of a television.) FIG. 19 illustrates the mount 264 just after the mount 264 touches the bonding surface 350.

Bendable beams (e.g., as illustrated in FIG. 4) can enable simultaneously controlling the orientation of multiple adhesive surfaces even though the adhesive surfaces move independently. If the user of the mount 4 (shown in FIG. 4) moves the relative orientations of the adhesive surfaces, the bendable beams can spring back to their neutral positions (e.g., parallel to each other) prior to installation to preclude installation errors. Thus, users of the mount 4 do not have to manually align all of the adhesive surfaces prior to installation to preclude installation errors.

FIG. 19 illustrates a challenge associated with flexible necks that are not configured to spring back to a neutral position. When a user of the mount 264 removes covers from the adhesive surfaces 284, the user will typically change the orientations of the adhesive surfaces 284 (e.g., as shown in FIG. 18). If the user does not manually align the adhesive surfaces 284 prior to pressing the mount 264 to a bonding surface 350, the random orientations of the adhesive surfaces 284 will typically preclude the adhesive surfaces 284 from fully bonding with the bonding surface 350. For example, in many cases, only a small portion of the adhesive surfaces 284 will touch the bonding surface 350. Springs can be used to automatically move the adhesive surfaces 284 back to neutral positions (e.g., prior to the adhesive surfaces 284 bonding to a television).

None of the steps described herein is essential or indispensable. Any of the steps can be adjusted or modified. Other or additional steps can be used. Any portion of any of the steps, processes, structures, and/or devices disclosed or illustrated in one embodiment, flowchart, or example in this specification can be combined or used with or instead of any other portion of any of the steps, processes, structures, and/or devices disclosed or illustrated in a different embodiment, flowchart, or example. The embodiments and examples provided herein are not intended to be discrete and separate from each other.

The section headings and subheadings provided herein are non-limiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

Some of the devices, systems, embodiments, and processes use computers. Each of the routines, processes, methods, and algorithms described in the preceding sections may be embodied in, and fully or partially automated by, code modules executed by one or more computers, computer processors, or machines configured to execute computer instructions. The code modules may be stored on any type of non-transitory computer-readable storage medium or tangible computer storage device, such as hard drives, solid state memory, flash memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments include A, B, and C. The term "and/or" is used to avoid unnecessary redundancy.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the inventions disclosed herein.

The following is claimed:

1. A mount configured to hold an electronic device and configured to couple the electronic device to a backside of a television, the mount comprising:

a base having an outward side and an inward side, wherein the inward side faces towards the backside of the television;

a first side wall that protrudes outward from the outward side of the base and outward away from the backside of the television;

a second side wall that protrudes outward from the outward side of the base and outward away from the backside of the television, wherein the first side wall and the second side wall are configured to couple the electronic device to the mount;

a first flexible neck that protrudes from the inward side of base, wherein the first flexible neck couples the base to a first adhesive surface, wherein the first adhesive surface couples the first flexible neck to the backside of the television; and a second flexible neck that protrudes from the inward side of base, wherein the second flexible neck couples the base to a second adhesive surface, wherein the second adhesive surface couples the second flexible neck to the backside of the television, wherein the first flexible neck and the second flexible neck are configured to move independently of each other to change a first orientation of the first adhesive surface relative to the second adhesive surface and to change a second orientation of the first adhesive surface relative to the base.

2. The mount of claim 1, wherein the first flexible neck comprises a first distal end and a first proximal end, the first proximal end of the first flexible neck is coupled to the base, and the first distal end of the first flexible neck is coupled to the first adhesive surface; and
the second flexible neck comprises a second distal end and a second proximal end, the second proximal end of the second flexible neck is coupled to the base, and the second distal end of the second flexible neck is coupled to the second adhesive surface.

3. The mount of claim 1, further comprising:
a first retaining lip coupled to the first side wall such that the first side wall couples the first retaining lip to the base; and
a second retaining lip coupled to the second side wall such that the second side wall couples the second retaining lip to the base, wherein the first retaining lip protrudes towards the second retaining lip, and wherein the first retaining lip and the second retaining lip wrap partially around the electronic device.

4. The mount of claim 1, further comprising a platform that protrudes from the inward side of the base, wherein the platform comprises an inwardly facing surface, wherein the inwardly facing surface comprises a surface area that is greater than a combined surface area of all adhesive surfaces of the mount, and wherein the platform couples the first flexible neck to the base and the platform couples the second flexible neck to the base.

5. The mount of claim 1, wherein the first flexible neck comprises a first bendable beam that couples the base to the first adhesive surface, wherein the first bendable beam is arranged and configured to bend to change a third orientation of the first adhesive surface relative to the base.

6. The mount of claim 5, wherein a first proximal end of the first bendable beam is immobile relative to the base while the first bendable beam bends to move the first adhesive surface relative to the base, and the second flexible neck comprises a second bendable beam.

7. The mount of claim 5, wherein the first bendable beam protrudes from the base in a fourth orientation, and the first bendable beam is configured to bend to rotate the first adhesive surface relative to the base and then spring back towards the fourth orientation due to flexibility of the first bendable beam.

8. The mount of claim 7, wherein the first bendable beam comprises a first rectangular beam having a first length, a first thickness, and a first width, wherein the first length is at least 2 millimeters and less than 13 millimeters, and the first width is at least twice as large as the first thickness,
wherein the second flexible neck comprises a second bendable beam having a second rectangular beam, the second rectangular beam having a second length, a second thickness, and a second width, wherein the second length is at least 2 millimeters and less than 13 millimeters, and the second width is at least twice as large as the second thickness.

9. The mount of claim 7, wherein the first bendable beam comprises a first neutral position, wherein the first bendable beam is configured to spring back towards the first neutral position when the first adhesive surface is unrestrained, and
wherein the second flexible neck comprises a second bendable beam having a second neutral position, wherein the second bendable beam is configured to spring back towards the second neutral position when the second adhesive surface is unrestrained.

10. The mount of claim 9, wherein the first neutral position is parallel to the second neutral position.

11. The mount of claim 9, wherein in the first neutral position the first flexible neck protrudes perpendicularly relative to the base and the first adhesive surface is oriented parallel to the base,
wherein in the second neutral position the second flexible neck protrudes perpendicularly relative to the base and the second adhesive surface is oriented parallel to the base, and
wherein the first adhesive surface and the second adhesive surface are coplanar when the first flexible neck is in the first neutral position and the second flexible neck is in the second neutral position.

12. A mount configured to hold an electronic device and configured to couple the electronic device to a backside of a television, the mount comprising:
a base having an outward side and an inward side, wherein the inward side is configured to face towards the backside of the television;
a first side wall that protrudes outward from the outward side of the base;
a second side wall that protrudes outward from the outward side of the base, wherein the first side wall and the second side wall are configured to couple the electronic device to the mount, and wherein the first sidewall and the second sidewall are configured to protrude outward away from the backside of the television;
a first flexible neck that protrudes from the base, wherein the first flexible neck couples the base to a first adhesive surface, the first flexible neck having a first spring configured such that moving a first distal portion of the first spring relative to the base causes the first adhesive surface to move relative to the base; and
a second flexible neck that protrudes from the base, wherein the second flexible neck couples the base to a second adhesive surface, the second flexible neck having a second spring configured such that moving a second distal portion of the second spring relative to the base causes the second adhesive surface to move relative to the base, wherein the first and second adhesive surfaces couple the first and second flexible necks to the backside of the television.

13. The mount of claim 12, wherein the first spring is a first cantilever spring having a first distal end and a first proximal end, and wherein the second spring is a second cantilever spring having a second distal end and a second proximal end.

14. The mount of claim 13, wherein the first proximal end of the first cantilever spring is coupled to the base, and the first distal end of the first cantilever spring is coupled to the first adhesive surface, wherein the first adhesive surface couples the first cantilever spring to the backside of the television,
wherein the second proximal end of the second cantilever spring is coupled to the base, and the second distal end of the second cantilever spring is coupled to the second adhesive surface, wherein the second adhesive surface couples the second cantilever spring to the backside of the television, and
wherein the first cantilever spring and the second cantilever spring are configured to flex independently of each other to change a first orientation of the first adhesive surface relative to the second adhesive surface and to change a second orientation of the first adhesive surface relative to the base.

15. The mount of claim 13, wherein the first cantilever spring protrudes from the base in a fourth orientation, and the first cantilever spring is configured to bend to rotate the first adhesive surface relative to the base and then spring back towards the fourth orientation due to flexibility of the first cantilever spring.

16. The mount of claim 13, wherein the first cantilever spring comprises a first neutral position, wherein the first cantilever spring is configured to spring back towards the first neutral position when the first adhesive surface is unrestrained, and the second cantilever spring comprises a second neutral position, wherein the second cantilever spring is configured to spring back towards the second neutral position when the second adhesive surface is unrestrained, wherein the first neutral position is parallel to the second neutral position.

17. The mount of claim 16, wherein in the first neutral position the first cantilever spring protrudes perpendicularly relative to the base and the first adhesive surface is oriented parallel to the base, wherein in the second neutral position the second cantilever spring protrudes perpendicularly relative to the base and the second adhesive surface is oriented parallel to the base, and wherein the first adhesive surface and the second adhesive surface are coplanar when the first cantilever spring is in the first neutral position and the second cantilever spring is in the second neutral position.

18. The mount of claim 13, wherein the first cantilever spring comprises a first rectangular plastic beam having a first length, a first thickness, and a first width, wherein the first length is at least 2 millimeters and less than 13 millimeters, and the first width is at least twice as large as the first thickness, wherein the second cantilever spring comprises a second rectangular plastic beam having a second length, a second thickness, and a second width, wherein the second length is at least 2 millimeters and less than 13 millimeters, and the second width is at least twice as large as the second thickness, and wherein the first adhesive surface couples the first cantilever spring to the backside of the television, and the second adhesive surface couples the second cantilever spring to the backside of the television.

19. The mount of claim 12, further comprising:

a first retaining lip coupled to the first side wall such that the first side wall couples the first retaining lip to the base; and a second retaining lip coupled to the second side wall such that the second side wall couples the second retaining lip to the base, wherein the first retaining lip and the second retaining lip wrap at least partially around the electronic device while the mount couples the electronic device to the backside of the television.

* * * * *